(12) United States Patent
Fujita

(10) Patent No.: US 11,081,494 B2
(45) Date of Patent: Aug. 3, 2021

(54) SEMICONDUCTOR MEMORY

(71) Applicant: Toshiba Memory Corporation, Minato-ku (JP)

(72) Inventor: Masanari Fujita, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 86 days.

(21) Appl. No.: 16/261,939

(22) Filed: Jan. 30, 2019

(65) Prior Publication Data

US 2020/0013796 A1  Jan. 9, 2020

(30) Foreign Application Priority Data

Jul. 9, 2018 (JP) .............................. JP2018-129771

(51) Int. Cl.
| | |
|---|---|
| *H01L 27/11582* | (2017.01) |
| *H01L 29/10* | (2006.01) |
| *H01L 29/51* | (2006.01) |
| *H01L 29/49* | (2006.01) |
| *H01L 21/02* | (2006.01) |

(Continued)

(52) U.S. Cl.
CPC .. *H01L 27/11582* (2013.01); *H01L 27/11565* (2013.01); *H01L 29/1037* (2013.01); *H01L 29/40117* (2019.08); *H01L 29/4966* (2013.01); *H01L 29/513* (2013.01); *H01L 29/518* (2013.01); *H01L 21/0217* (2013.01); *H01L 21/0274* (2013.01); *H01L 21/02164* (2013.01); *H01L 21/28525* (2013.01);
(Continued)

(58) Field of Classification Search
CPC ......... H01L 27/11582; H01L 29/40117; H01L 29/1037; H01L 29/513; H01L 29/4966; H01L 27/11565; H01L 29/518; H01L 21/31111; H01L 21/02164; H01L 21/0217; H01L 21/31144; H01L 21/0274; H01L 21/31116; H01L 21/28525; H01L 27/1157

See application file for complete search history.

(56) References Cited

U.S. PATENT DOCUMENTS

| | | |
|---|---|---|
| 9,570,464 B1 | 2/2017 | Wakatsuki et al. |
| 2009/0267128 A1 | 10/2009 | Maejima |

(Continued)

FOREIGN PATENT DOCUMENTS

| | | |
|---|---|---|
| JP | 2013-534058 | 8/2013 |
| JP | 2017-163044 | 9/2017 |
| TW | 201513314 A | 4/2015 |

*Primary Examiner* — Steven H Loke
*Assistant Examiner* — Juanita B Rhodes
(74) *Attorney, Agent, or Firm* — Oblon, McClelland, Maier & Neustadt, L.L.P.

(57) ABSTRACT

A semiconductor memory according to an embodiment includes a first conductor, a first insulator and memory pillars. The first conductor and the first insulator are alternately stacked along a first direction. The memory pillars penetrates through the stacked first conductor and first insulator. Each of the memory pillars include a semiconductor, a tunnel insulating film, a second insulator, and a block insulating film. The memory pillars include a first memory pillar. The stacked first insulator includes a first layer and a second layer that are adjacent to each other in the first direction. The first conductor between the first layer and the second layer includes a first conductive part, a second conductive part, and a first dissimilar conductive part.

10 Claims, 30 Drawing Sheets

(51) Int. Cl.
  *H01L 21/285*  (2006.01)
  *H01L 27/1157*  (2017.01)
  *H01L 27/11565*  (2017.01)
  *H01L 21/28*  (2006.01)
  *H01L 21/311*  (2006.01)
  *H01L 21/027*  (2006.01)

(52) U.S. Cl.
  CPC .... *H01L 21/31111* (2013.01); *H01L 21/31116* (2013.01); *H01L 21/31144* (2013.01); *H01L 27/1157* (2013.01)

(56) References Cited

U.S. PATENT DOCUMENTS

| | | |
|---|---|---|
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2014/0203346 A1* | 7/2014 | Lee .................. H01L 27/11565 257/324 |
| 2015/0060992 A1 | 3/2015 | Taekyung et al. |
| 2015/0179662 A1 | 6/2015 | Makala et al. |
| 2016/0268283 A1 | 9/2016 | Kitamura et al. |
| 2017/0229475 A1* | 8/2017 | Yasuda ............. H01L 21/02164 |
| 2017/0263613 A1 | 9/2017 | Murakoshi et al. |
| 2018/0366474 A1* | 12/2018 | Kim .................. H01L 27/1157 |

* cited by examiner

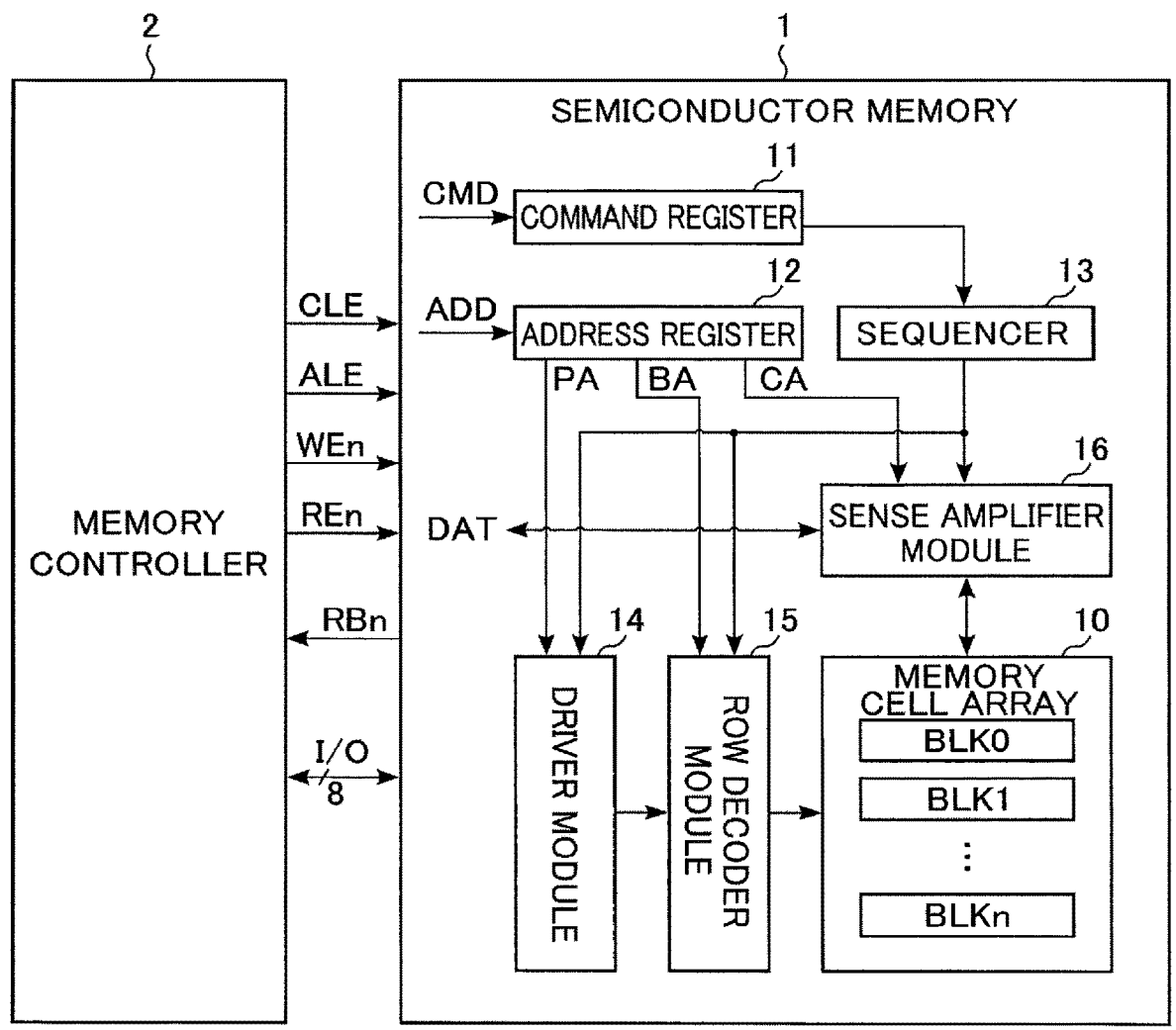
F I G. 1

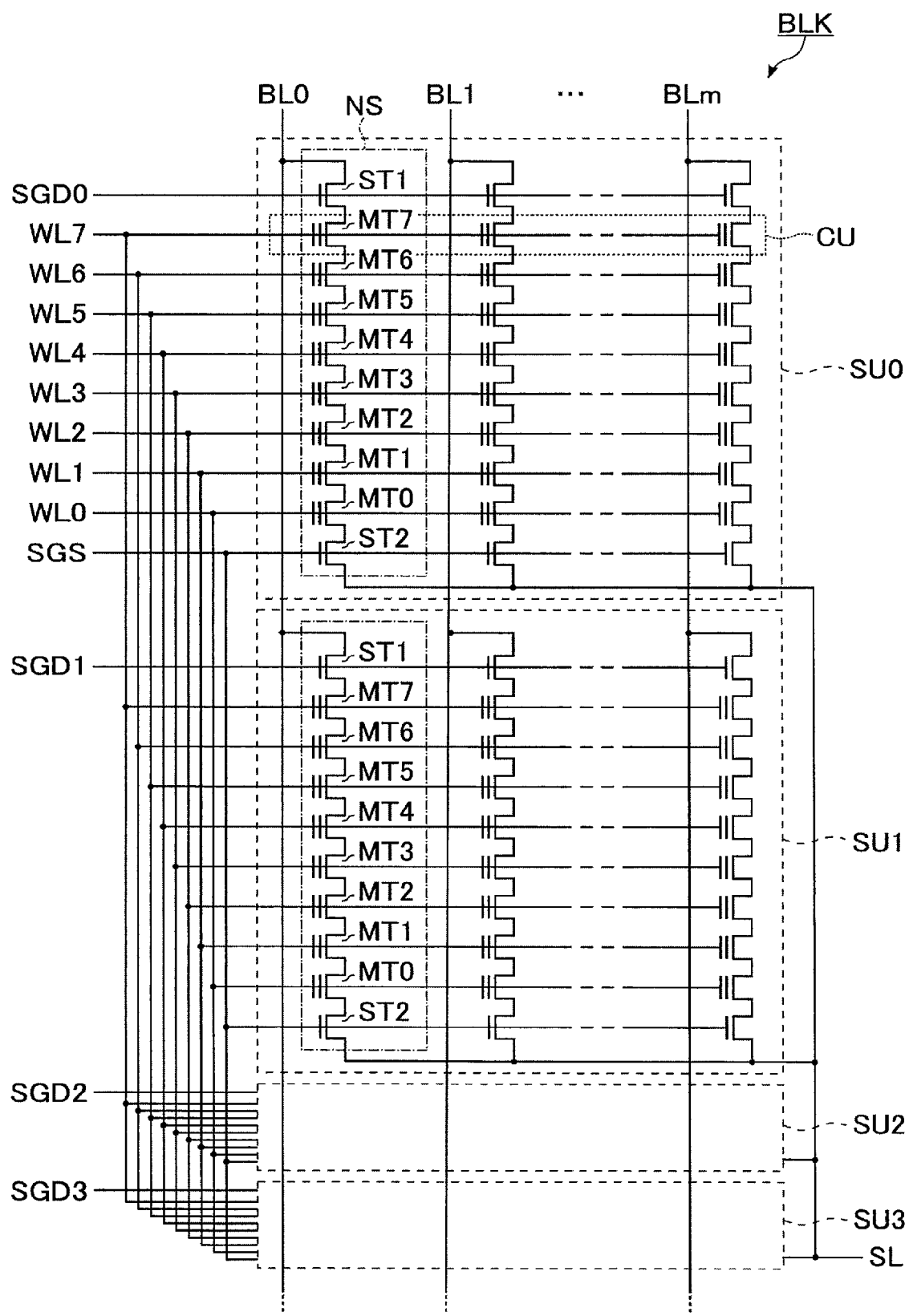
F I G. 2

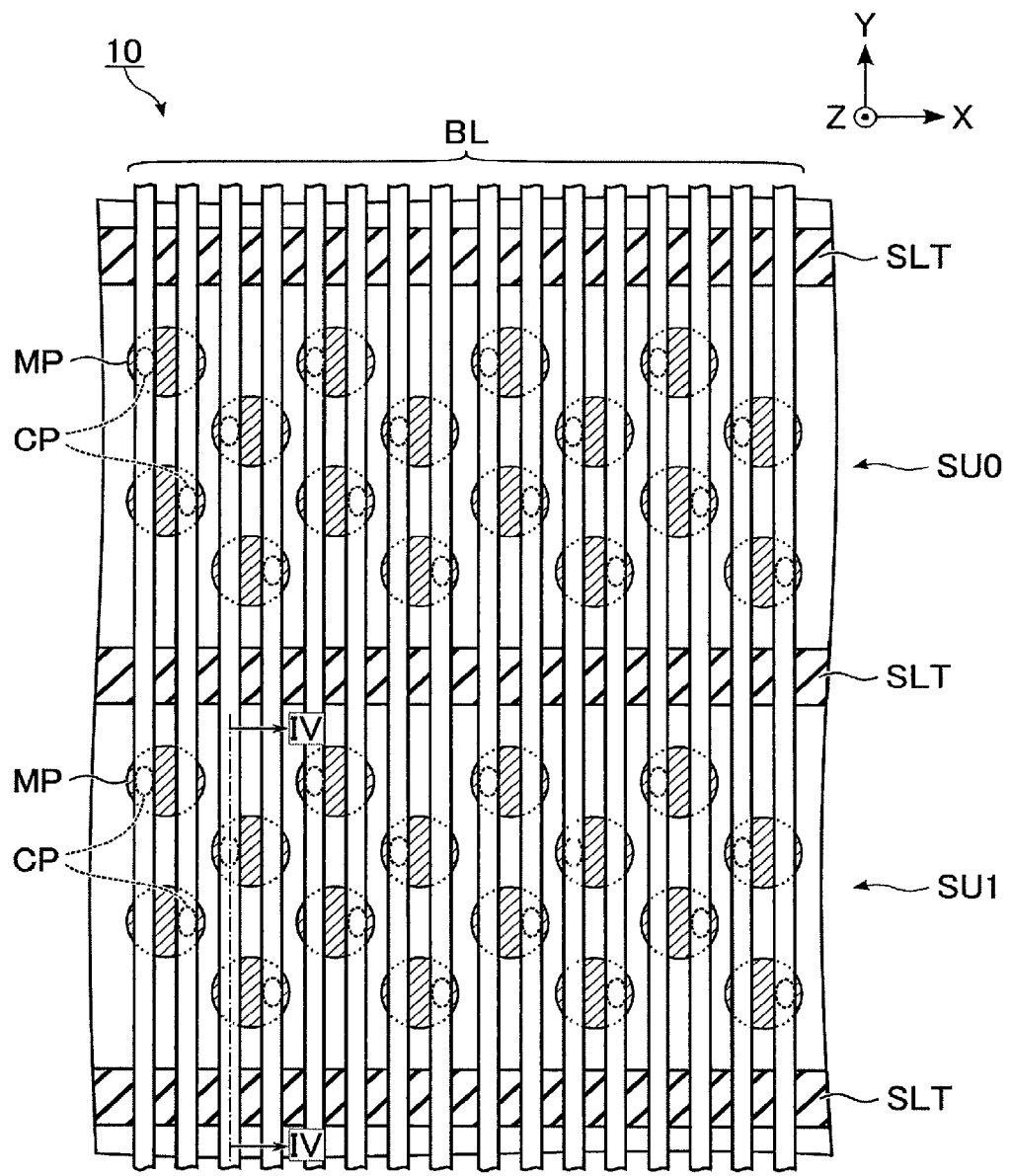
F I G. 3

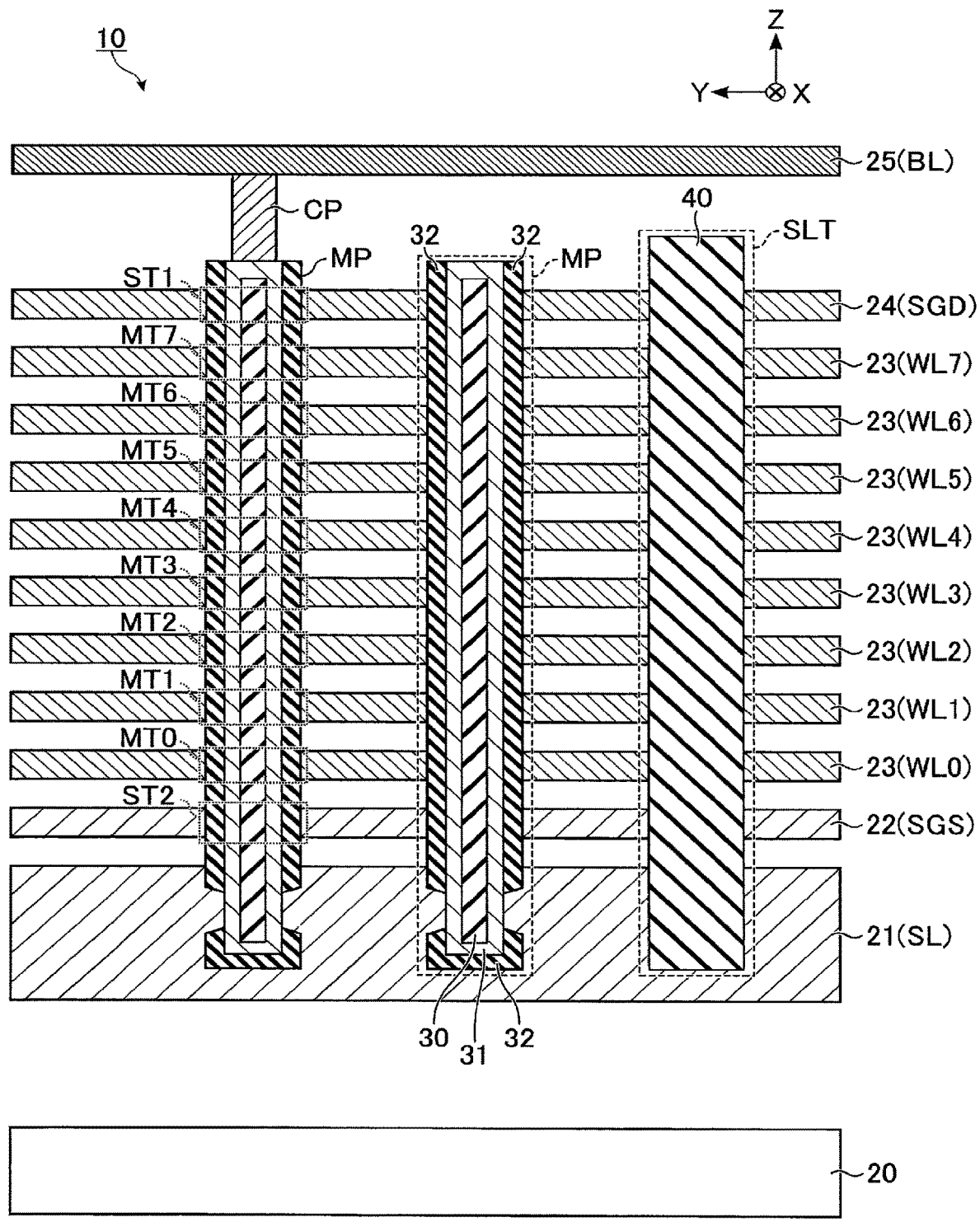
F I G. 4

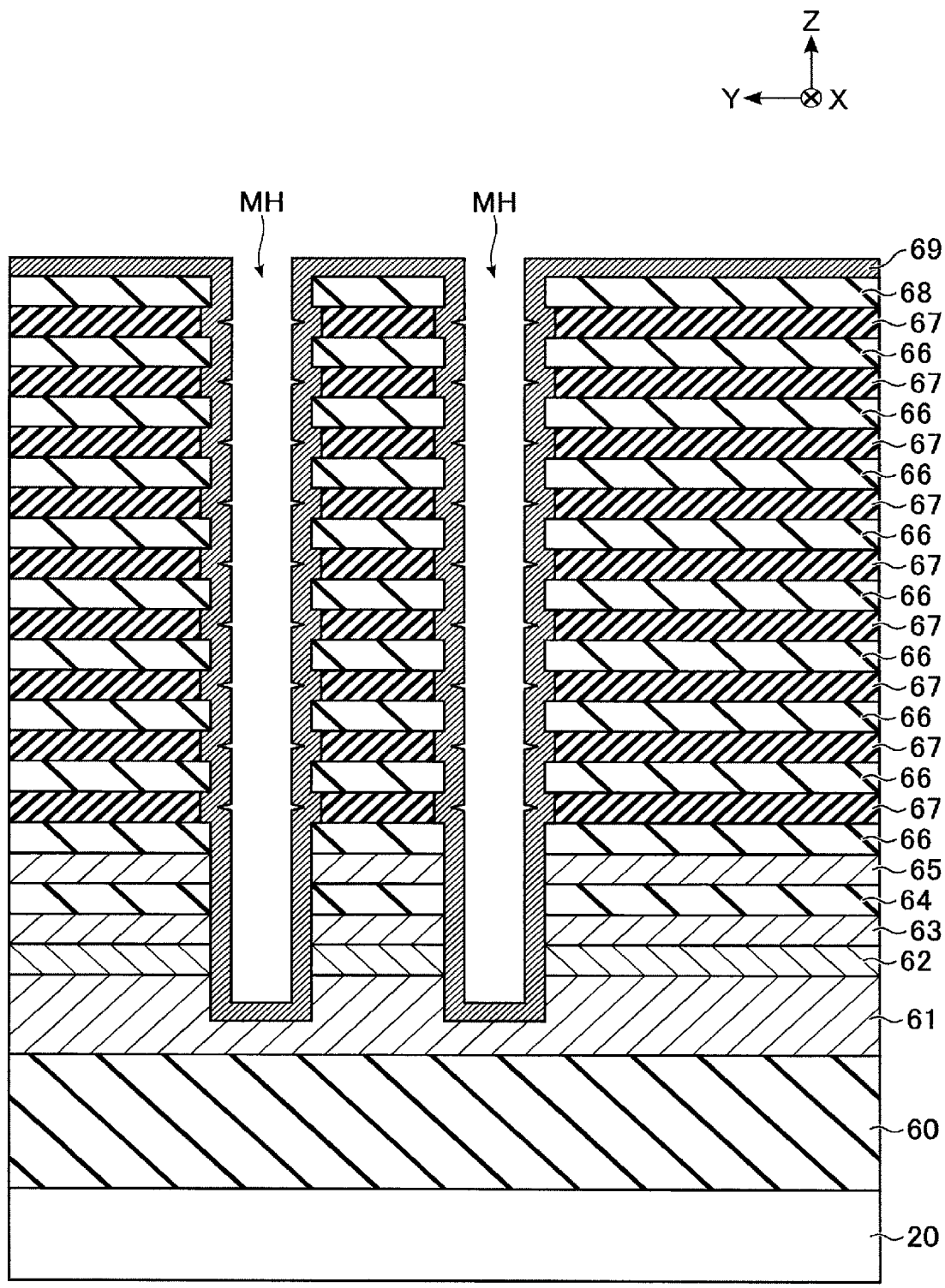
F I G. 13

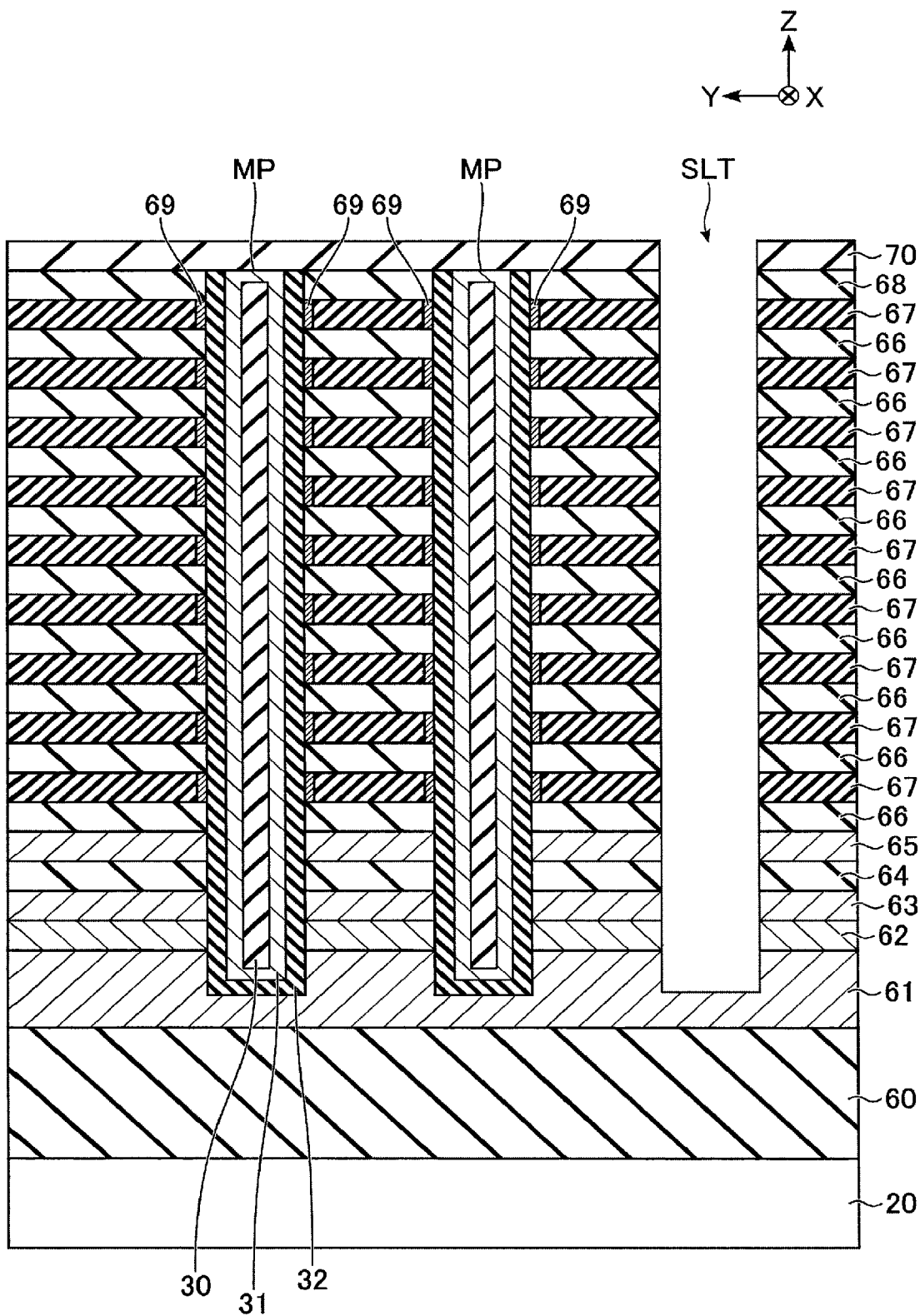
F I G. 19

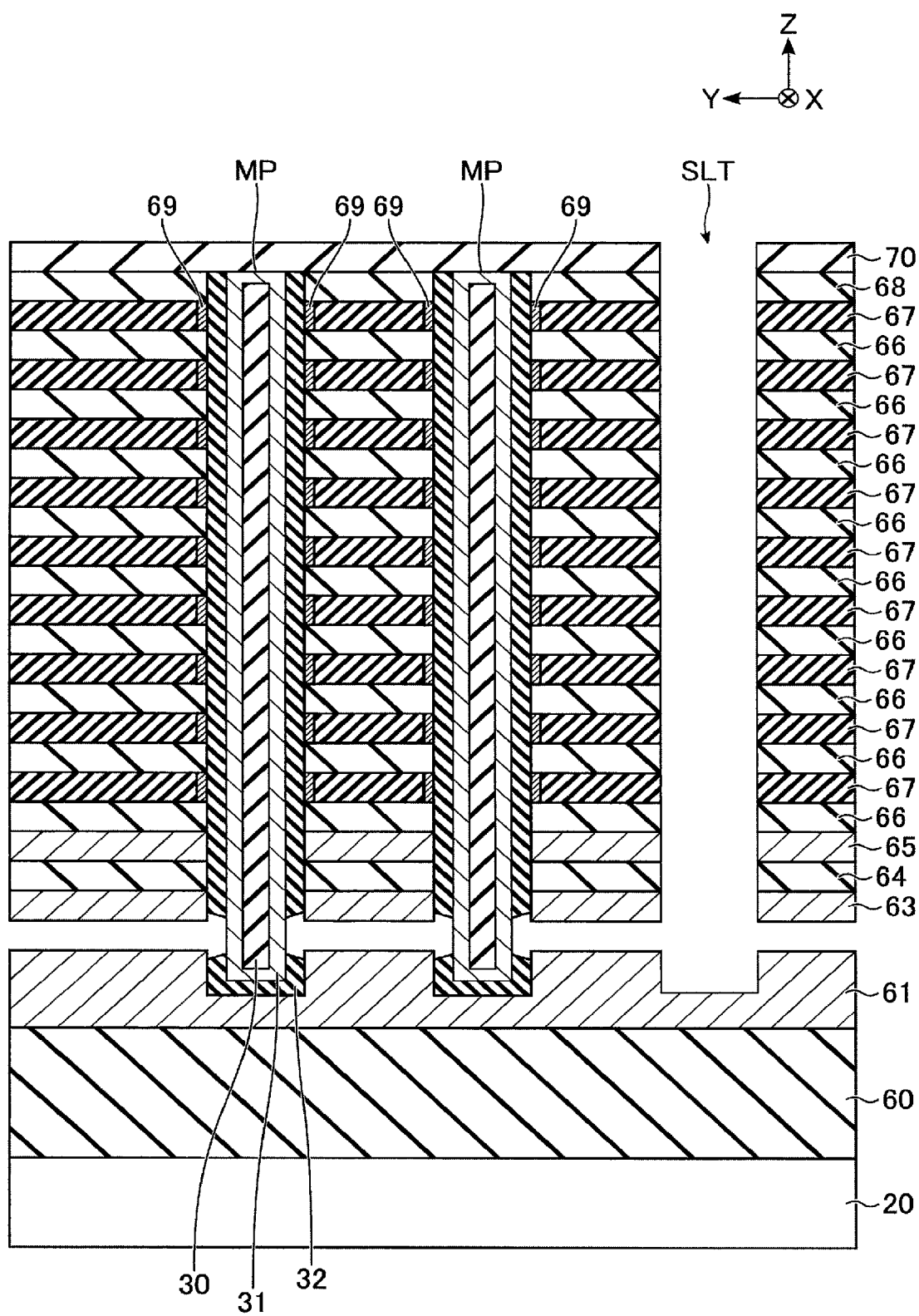
F I G. 20

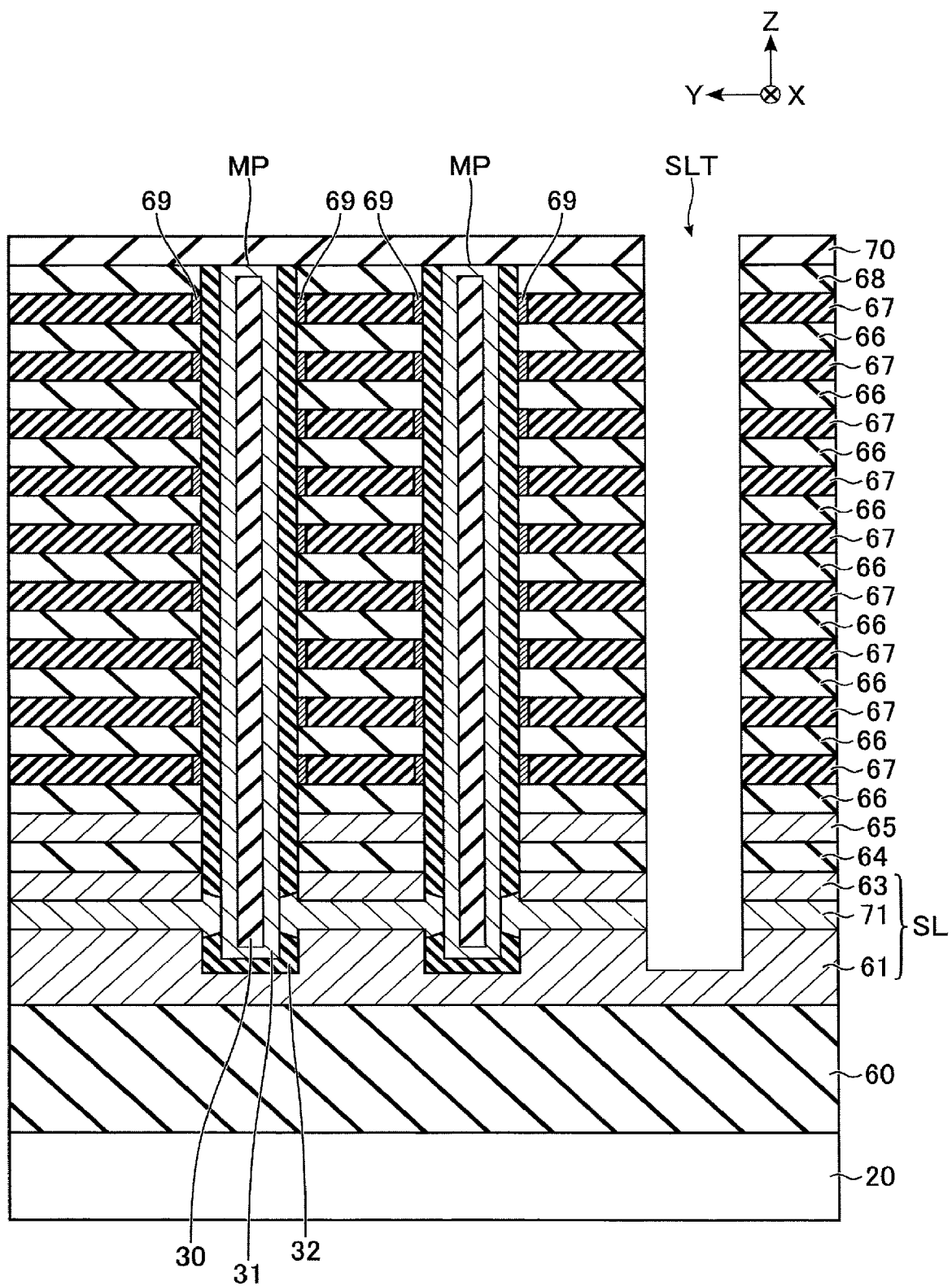
F I G. 21

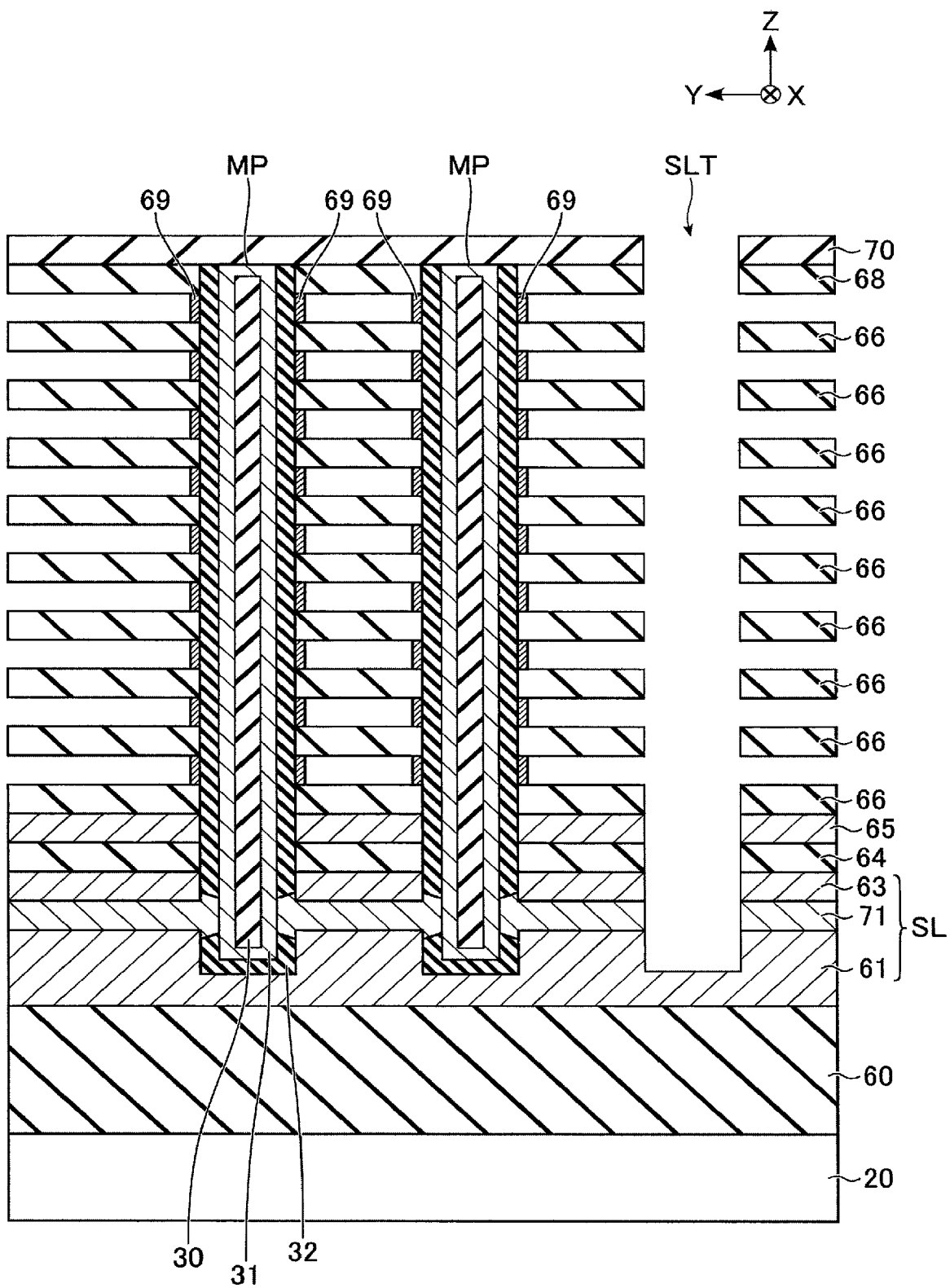
F I G. 22

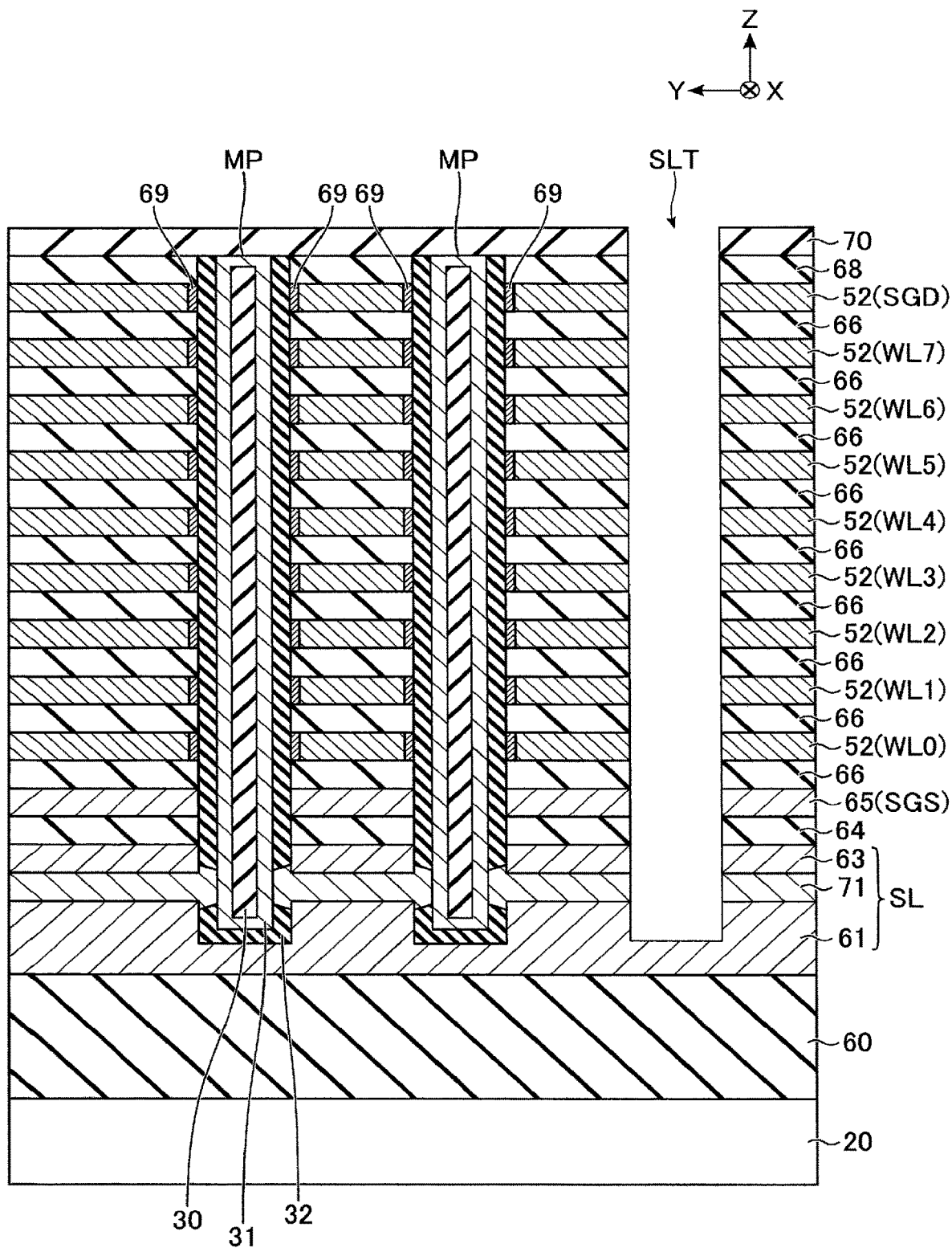
F I G. 24

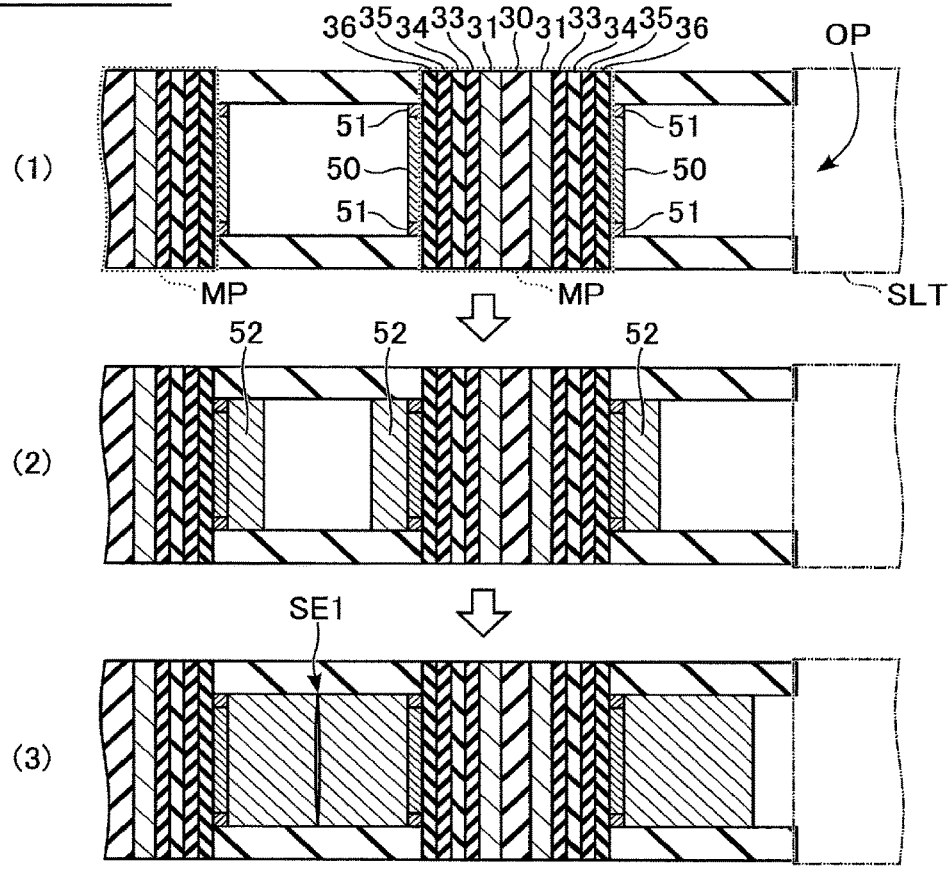
F I G. 29
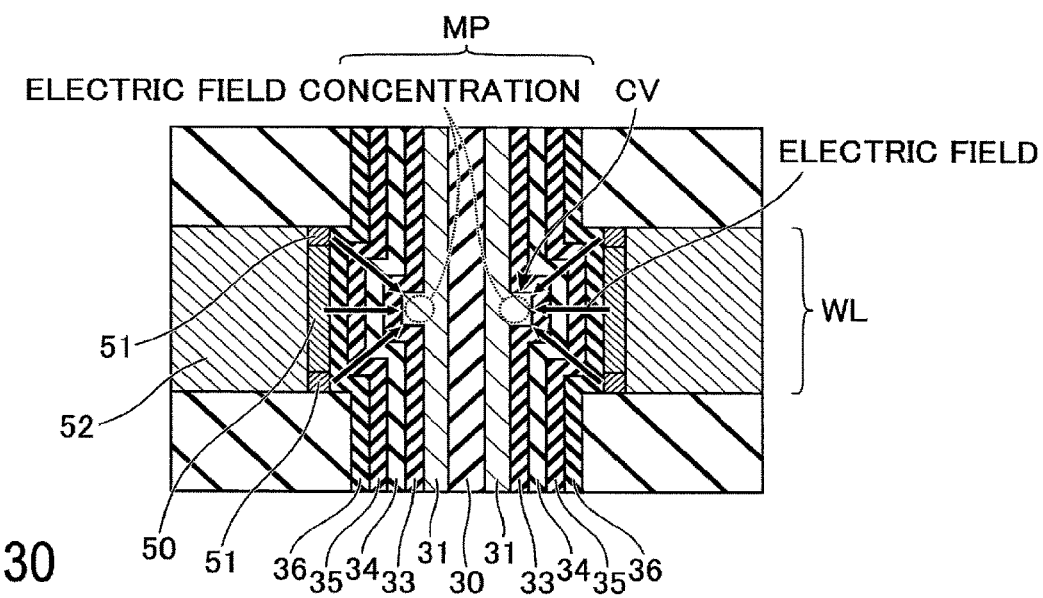
F I G. 30

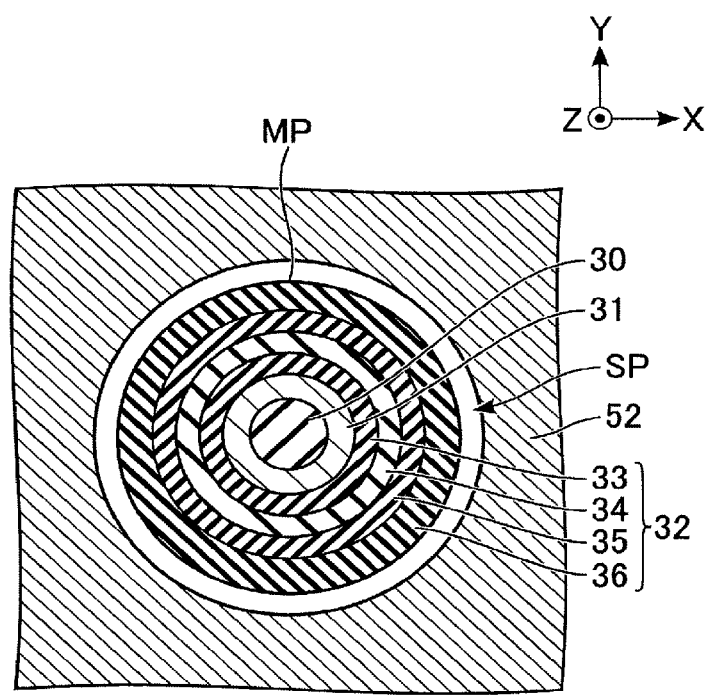
F I G. 32

SEMICONDUCTOR MEMORY

CROSS-REFERENCE TO RELATED APPLICATIONS

This application is based upon and claims the benefit of priority from Japanese Patent Application No. 2018-129771, filed Jul. 9, 2018, the entire contents of which are incorporated herein by reference.

FIELD

Embodiments relate to a semiconductor memory.

BACKGROUND

There is known an NAND-type flash memory that is capable of storing data in a nonvolatile manner.

BRIEF DESCRIPTION OF THE DRAWINGS

FIG. 1 is a block diagram illustrating a configuration example of a semiconductor memory according to an embodiment;

FIG. 2 is a circuit diagram illustrating an example of a circuit configuration of a memory cell array included in the semiconductor memory according to the embodiment;

FIG. 3 is a plane view of an example of a planar layout of the memory cell array included in the semiconductor memory according to the embodiment;

FIG. 4 is a cross-sectional view of an example of a cross-section structure of the memory cell array included in the semiconductor memory according to the embodiment;

FIGS. 9, 10, 11, 12, and 13 are cross-sectional views of the memory cell array, illustrating an example of a manufacturing process of the semiconductor memory according to the embodiment;

FIGS. 19, 20, 21, and 22 are cross-sectional views of the memory cell array, illustrating the example of the manufacturing process of the semiconductor memory according to the embodiment;

FIG. 24 is a cross-sectional view of the memory cell array, illustrating the example of the manufacturing process of the semiconductor memory according to the embodiment;

FIG. 29 is a diagram illustrating an example of a formation process of stacking wires in the semiconductor memory according to the embodiment;

FIG. 30 is a diagram illustrating an example of an advantage of a memory cell transistor in the semiconductor memory according to the embodiment;

FIG. 32 is a cross-sectional view of an example of a cross-section structure of a memory pillar included in the semiconductor memory according to the modification example of the embodiment.

DETAILED DESCRIPTION

Figure 5:
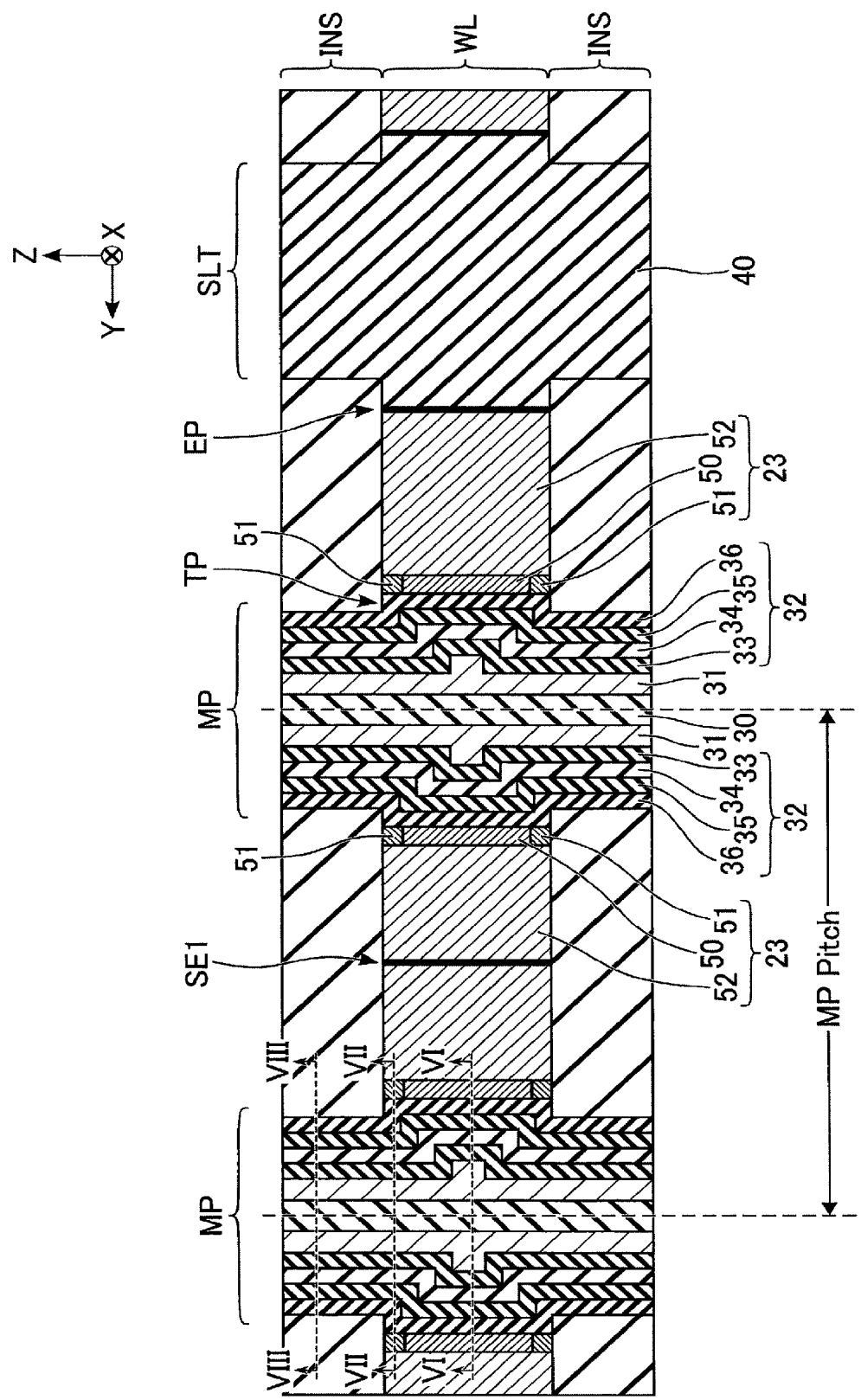
FIG. 5 is a cross-sectional view of an example of a more detailed cross-section structure of the memory cell array included in the semiconductor memory according to the embodiment.

A semiconductor memory according to an embodiment includes a first conductor, a first insulator and a plurality of memory pillars. The first conductor and the first insulator are alternately stacked along a first direction. The plurality of memory pillars penetrates through the stacked first conductor and first insulator. Each of the memory pillars include a semiconductor along the first direction, a tunnel insulating film that surrounds a side surface of the semiconductor, a second insulator that surrounds a side surface of the tunnel insulating film, and a block insulating film that surrounds a side surface of the second insulator. The memory pillars include a first memory pillar. The stacked first insulator includes a first layer and a second layer that are adjacent to each other in the first direction. The first conductor between the first layer and the second layer includes a first conductive part, a second conductive part, and a first dissimilar conductive part. The first conductive part is in contact with the first layer and the second layer and widens along a second direction crossing the first direction. The second conductive part is provided between a block insulating film of the first memory pillar and the first conductive part, is in contact with the block insulating film and the first conductive part, and is formed from the same material as for the first conductive part. The first dissimilar conductive part is a pair of conductive parts that sandwiches the second conductive part along the first direction between the block insulating film of the first memory pillar and the first conductive part, and is formed from a material different from the material for the first conductive part and the second conductive part.

Embodiments will be described below with reference to the drawings. Each of the embodiments exemplifies a device or method of carrying out the technical ideas of the invention. The drawings are schematic or conceptual and thus the dimensions, ratios, and others illustrated in the drawings may not necessarily be identical to the real ones. The technical ideas of the present invention are not specified by the shapes, structures, layouts, and others of constituent elements.

In the following descriptions, the constituent elements with approximately identical functions and configurations will be given identical reference signs. The numeral appended to a character constituting a reference sign is referred to by a reference sign including the same character and is used to differentiate between the elements having similar configurations. Similarly, the character appended to a numeral constituting a reference sign are referred to by a reference sign including the same numeral and is used to differentiate between the elements having similar configurations. When there is no need to differentiate between the elements indicated by the reference signs including the same character or numeral, each of these elements is referred to by the reference sign including only the character or numeral.

[1] EMBODIMENTS

A semiconductor memory 1 according to an embodiment will be described below.

[1-1] Configuration of the Semiconductor Memory 1

[1-1-1] Overall Configuration of the Semiconductor Memory 1

The semiconductor memory 1 is an NAND-type flash memory that is capable of storing data in a nonvolatile manner, for example. The semiconductor memory 1 is controlled by an external memory controller 2, for example. FIG. 1 illustrates a configuration example of the semiconductor memory 1 according to the embodiment.

As illustrated in FIG. 1, the semiconductor memory 1 includes a memory cell array 10, a command register 11, an address register 12, a sequencer 13, a driver module 14, a row decoder module 15, and a sense amplifier module 16, for example.

The memory cell array 10 includes a plurality of blocks BLK0 to BLKn (n is an integer of 1 or larger). The block BLK is a set of a plurality of memory cells that is capable of storing data in a nonvolatile manner and is used as an erase unit of data, for example.

The memory cell array 10 has a plurality of bit lines and a plurality of word lines. Each of memory cells is associated with one bit line and one word line, for example. The detailed configuration of the memory cell array 10 will be described later.

The command register 11 holds a command CMD received by the semiconductor memory 1 from the memory controller 2. The command CMD includes an order for causing the sequencer 13 to execute a read operation, a write operation, an erase operation, or the like, for example.

The address register 12 holds address information ADD received by the semiconductor memory 1 from the memory controller 2. The address information ADD includes a block address BA, a page address PA, and a column address CA, for example. For example, the block address BA, the page address PA, and the column address CA are used to select the block BLK, the word line, and the bit line, respectively.

The sequencer 13 controls the entire operations of the semiconductor memory 1. For example, the sequencer 13 controls the driver module 14, the row decoder module 15, the sense amplifier module 16, and others, based on the command CMD held in the command register 11 to execute a read operation, a write operation, an erase operation, or the like.

The driver module 14 generates a voltage to be used for a read operation, a write operation, an erase operation, or the like. The driver module 14 applies the generated voltage to a signal line corresponding to the selected word line, based on the page address PA held in the address register 12, for example.

The row decoder module 15 selects one block BLK in the corresponding memory cell array 10, based on the block address BA held in the address register 12. The row decoder module 15 transfers the voltage applied to the signal line corresponding to the selected word line to the selected word line in the selected block BLK, for example.

At a write operation, the sense amplifier module 16 applies a desired voltage to each of the bit lines according to write data DAT received from the memory controller 2. At a read operation, the sense amplifier module 16 determines the data stored in the memory cell based on the voltage in the bit line, and transfers the determination result as read data DAT to the memory controller 2.

Communications between the semiconductor memory 1 and the memory controller 2 comply with NAND interface standards, for example. For example, used for communications between the semiconductor memory 1 and the memory controller 2 are a command latch enable signal CLE, an address latch enable signal ALE, a write enable signal WEn, a read enable signal REn, a ready busy signal RBn, and an input/output signal I/O.

The command latch enable signal CLE is a signal indicating that the input/output signal I/O received by the semiconductor memory 1 is the command CMD. The address latch enable signal ALE is a signal indicating that the signal I/O received by the semiconductor memory 1 is the address information ADD. The write enable signal WEn is a signal for ordering the semiconductor memory 1 to input the input/output signal I/O. The read enable signal REn is a signal for ordering the semiconductor memory 1 to output the input/output signal I/O.

The ready busy signal RBn is a signal for notifying the memory controller 2 of whether the semiconductor memory 1 is in a ready state where to accept an order from the memory controller 2 or in a busy state where not to accept an order. The input/output signal I/O is an 8-bit signal that can include the command CMD, the address information ADD, the data DAT, and others, for example.

The semiconductor memory 1 and the memory controller 2 described above may constitute one semiconductor device in combination. Examples of such a semiconductor device include a memory card such as SD™ card, a solid state drive (SSD), and others.

[1-1-2] Circuit Configuration of the Memory Cell Array 10

FIG. 2 illustrates an example of a circuit configuration of the memory cell array 10 included in the semiconductor memory 1 according to the embodiment, extracting one block BLK from the plurality of blocks BLK included in the memory cell array 10.

As illustrated in FIG. 2, the block BLK includes four string units SU0 to SU3, for example. Each of the string units SU includes a plurality of NAND strings NS.

The NAND strings NS are associated with bit lines BL0 to BLm (m is an integer of 1 or larger). Each of the NAND strings NS includes memory cell transistors MT0 to MT7 and select transistors ST1 and ST2.

Each of the memory cell transistors MT includes a control gate and a charge accumulation layer to hold data in a nonvolatile manner. The select transistors ST1 and ST2 are used to select the string unit SU and the block BLK at the time of various operations.

In each of the NAND strings NS, the memory cell transistors MT0 to MT7 are connected in series between the select transistors ST1 and ST2. In the same block BLK, the control gates of the memory cell transistors MT0 to MT7 are respectively connected in common to the word lines WL0 to WL7.

In each of the NAND strings NS, the drain of the select transistor ST1 is connected to the associated bit line BL, and the source of the select transistor ST1 is connected to one each end of the memory cell transistors MT0 to MT7 connected in series. In the same block BLK, the gates of the select transistors ST1 in the string units SU0 to SU3 are respectively connected in common to the select gate lines SGD0 to SGD3.

In each of the NAND strings NS, the drain of the select transistor ST2 is connected to the other ends of the memory cell transistors MT0 to MT7 connected in series. In the same block BLK, the sources of the select transistors ST2 are connected in common to the source line SL, and the gates of the select transistors ST2 are connected in common to the select gate line SGS.

In the circuit configuration of the memory cell array 10 described above, the bit lines BL are connected in common between the plurality of NAND strings NS corresponding to the blocks BLK, for example. The source line SL is connected in common between the plurality of blocks BLK, for example.

A set of the plurality of memory cell transistors MT connected to the common word line WL in one string unit SU is called cell unit CU, for example. For example, the storage capacity of the cell unit CU including the memory cell transistors MT storing one each bit data is defined as "one page data", for example. The cell unit CU can have a storage capacity of two page data or more according to the bit count of the data stored in the memory cell transistors MT.

The circuit configuration of the memory cell array 10 included in the semiconductor memory 1 according to the embodiment is not limited to the configuration described above. For example, the numbers of the memory cell transistors MT and the select transistors ST1 and ST2 included in each of the NAND strings NS can be designed to arbitrary numbers. The number of the string units SU included in each of the blocks BLK can be designed to an arbitrary number.

[1-1-3] Structure of the Memory Cell Array 10

An example of a structure of the memory cell array 10 in the embodiment will be described below.

In the drawings referred to below, an X direction corresponds to the direction of extension of the word line WL, a Y direction corresponds to the direction of extension of the bit line BL, and a Z direction corresponds to the direction perpendicular to the surface of a semiconductor substrate 20 on which the semiconductor memory 1 is formed.

In the cross-sectional views referred to below, illustration of constituent elements such as insulating layers (inter-layer insulating films), wires, and contacts are omitted as appropriate for the sake of visibility. The planar views have hatching added as appropriate for the sake of visibility. The hatching added to the planar views is not necessarily related to the materials and characteristics of the constituent elements with the hatching.

FIG. 3 illustrates an example of a planar layout of the memory cell array 10 included in the semiconductor memory 1 according to the embodiment, extracting structural bodies corresponding to the string units SU0 and SU1.

As illustrated in FIG. 3, a region with the memory cell array 10 includes a plurality of slits SLT, a plurality of string units SU, and a plurality of bit lines BL, for example.

The plurality of slits SLT extends in the X direction and is arrayed in the Y direction. One string unit SU is disposed between the slits SLT adjacent to each other in the Y direction, for example.

Each of the string units SU includes a plurality of memory pillars MP. The plurality of memory pillars MP is disposed in a staggered pattern along the X direction, for example. Each of the memory pillars MP functions as one NAND string NS, for example.

The plurality of bit lines BL extends in the Y direction and is arrayed in the X direction. For example, the bit lines BL are disposed in such a manner as to overlap at least one memory pillar MP in each of the string units SU. Specifically, two bit lines BL overlap each of the memory pillars MP, for example.

Out of the plurality of bit lines BL overlapping the memory pillars MP, a contact CP is provided between one bit line BL and the memory pillar MP. Each of the memory pillars MP is electrically connected to the corresponding bit line BL via the contact CP.

The number of the string units SU provided between the adjacent slits SLT can be arbitrarily designed. The number and layout of the memory pillars MP illustrated in FIG. 3 are a mere example and the memory pillars MP can be designed to arbitrary number and layout. The number of the bit lines BL overlapping each of the memory pillars MP can be arbitrarily designed.

FIG. 4 is a cross-sectional view of FIG. 3 taken along line IV-IV, illustrating an example of a cross-section structure of the memory cell array 10 included in the semiconductor memory 1 according to the embodiment.

As illustrated in FIG. 4, the region with the memory cell array 10 includes conductors 21 to 25, the memory pillars MP, the contact CP, and the slit SLT.

Specifically, the conductor 21 is provided above the semiconductor substrate 20 with an insulating layer therebetween. For example, the conductor 21 is formed in a plate shape widened along an XY plane and is used as source line SL. The conductor 21 contains polysilicon (Si), for example.

Although not illustrated, a circuit such as the sense amplifier module 16 is provided in a region between the semiconductor substrate 20 and the conductor 21, for example.

The conductor 22 is provided above the conductor 21 with an insulating layer therebetween. For example, the conductor 22 is formed in a plate shape widened along the XY plane and is used as select gate line SGS. The conductor 22 contains polysilicon (Si), for example.

Insulating layers and the conductors 23 are alternately stacked above the conductor 22. For example, the conductors 23 are formed in a plate shape widened along the XY plane. The plurality of stacked conductors 23 is used as word lines WL0 to WL7 in sequence from the semiconductor substrate 20 side. The conductors 23 contain tungsten (W), for example.

The conductor 24 is provided above the top conductor 23 via an insulating layer therebetween. For example, the conductor 24 is formed in a plate shape widened along the XY plane and is used as select gate line SGD. The conductor 24 contains polysilicon (Si), for example.

The conductors 25 are provided above the conductor 24 with an insulating layer therebetween. For example, the conductors 25 are formed in a line shape extended along the Y direction and are used as bit lines BL. That is, the plurality of conductors 25 is aligned along the X direction in a region not illustrated. The conductors 25 contain copper (Cu), for example.

The memory pillars MP are formed in a columnar shape extended along the Z direction and penetrate through the conductors 22 to 24, for example. Specifically, the upper end of each of the memory pillars MP is included in a layer between the layer with the conductor 24 and the layer with the conductors 25, for example. The lower end of each of the memory pillars MP is included in the layer with the conductor 21, for example.

Each of the memory pillars MP includes a core member 30, a semiconductor 31, and a stacking film 32, for example.

The core member 30 is formed in a columnar shape extended along the Z direction. The upper end of the core member 30 is included in a layer above the layer with the conductor 24, for example. The lower end of the core member 30 is included in the layer with the conductor 21, for example. The core member 30 contains an insulator such as silicon oxide (SiO$_2$), for example.

The core member 30 is covered with the semiconductor 31. The semiconductor 31 is in contact with the conductor 21 via the side surface of the memory pillar MP. The semiconductor 31 is polysilicon (Si), for example. The stacking film 32 covers the side surface and bottom surface of the semiconductor 31 except for the portion of contact between the conductor 21 and the semiconductor 31.

The columnar contact CP is provided on the semiconductor 31. One conductor 25, that is, one bit line BL is in contact with the upper surface of the contact CP. The memory pillar MP and the conductor 25 may be electrically connected via two or more contacts or may be electrically connected via any other wiring.

The slit SLT is formed in a plate shape extended along the Z direction to divide the conductors 22 to 24, for example. Specifically, the upper end of the slit SLT is included in a layer between the layer including the upper end of the memory pillar MP and the layer with the conductors 25, for example. The lower end of the slit SLT is included in the layer with the conductor 21, for example.

An insulator 40 is provided in the slit SLT. The insulator 40 contains an insulating material such as silicon oxide (SiO$_2$), for example. The insulator 40 may be formed from a plurality of kinds of insulating materials. For example, before silicon oxide is embedded in the slit SLT, silicon nitride (SiN) may be formed as a side wall of the slit SLT.

In the configuration of the memory pillars MP described above, the portion of intersection between the memory pillars MP and the conductor 22 functions as select transistor ST2, for example. The portions of intersection between the memory pillars MP and the conductors 23 function as memory cell transistors MT. The portion of intersection between the memory pillars MP and the conductor 24 functions as select transistor ST1. That is, the semiconductor 31 functions as channels for the memory cell transistors MT and the select transistors ST1 and ST2.

FIG. 5 is a detailed cross-sectional view of the memory cell array 10 included in the semiconductor memory 1 according to the embodiment, extracting a wiring layer with one word line WL and two insulating layers INS sandwiching the wiring layer.

As illustrated in FIG. 5, the memory pillar MP includes a convex portion TP in the wiring layer with the word line WL. Specifically, in a part penetrating through the word line WL, the memory pillar MP has a portion sandwiched between the two insulating layers INS sandwiching the word line WL.

The stacking film 32 in the memory pillar MP includes a tunnel oxide film 33, an insulating film 34, and block insulating films 35 and 36, for example.

The tunnel oxide film 33 is provided to cover the side surface and bottom surface of the semiconductor 31. The insulating film 34 is provided to cover the side surface and bottom surface of the tunnel oxide film 33. The insulating film 34 is used as a charge accumulation layer of the memory cell transistor MT. The insulating film 34 contains silicon nitride (SiN), for example.

The block insulating film 35 is provided to cover the side surface and bottom surface of the insulating film 34. The block insulating film 36 is provided to cover the side surface and bottom surface of the block insulating film 35. The block insulating film 35 contains silicon oxide (SiO$_2$), for example. The block insulating film 36 contains aluminum oxide (Al$_2$O$_3$), for example.

Each of the conductors 23 used as word line WL includes conductive parts 50 to 52, for example.

The conductive parts 50 and 51 are provided on the side surface of the block insulating film 36. Specifically, each of the conductors 23 is provided with the conductive part 51 in contact with the upper insulating layer INS and the block insulating film 36, the conductive part 51 in contact with the lower insulating layer INS and the block insulating film 36, and the conductive part 50 that is sandwiched between the upper conductive part 51 and the lower conductive part 51 in the wiring layer and is in contact with the block insulating film 36.

The conductive part 50 contains tungsten (W), for example. The conductive parts 51 contain titanium nitride (TiN), for example, and are used as barrier metal in the manufacturing process of the semiconductor memory 1. In the semiconductor memory 1 according to the embodiment, the conductive part 50 and the conductive parts 51 are provided only near the outer periphery of the memory pillar MP.

Specifically, in a cross section parallel to the surface of the semiconductor substrate 20 and including the conductive part 50, the distance between the center of the memory pillar MP and the portion of the conductive part 50 in contact with the memory pillar MP and most distant from the memory pillar MP is shorter than half of the distance (MP pitch) between the centers of the adjacent memory pillars MP.

Similarly, in a cross section parallel to the surface of the semiconductor substrate 20 and including the conductive part 51, the distance between the center of the memory pillar MP and the portion of the conductive part 51 in contact with the memory pillar MP and most distant from the memory pillar MP is shorter than half of the distance (MP pitch) between the centers of the adjacent memory pillars MP.

The conductive part 52 is provided on the side surfaces of the conductive parts 50 and 51. Specifically, the conductive part 52 is provided to be widened along the XY plane in a region with the conductor 23 except for a region with the conductive parts 50 and 51, for example. In the semiconductor memory 1 according to the embodiment, the conductive part 52 is in contact with the upper insulating layer INS and the lower insulating layer INS. The conductive part 52 contains tungsten (W), for example, and contains the same metal material as that for the conductive parts 50.

Describing in other words the structure of the conductor 23 (the conductive parts 50 to 52) explained above, the conductive part 52 between the upper insulating layer INS and the lower insulating layer INS is a conductive part that is in contact with the upper insulating layer INS and the lower insulating layer INS and is widened along the XY plane. The conductive part 50 is a conductive part that is provided between the block insulating film 36 and the conductive part 52 of the memory pillar MP, is in contact with the block insulating film 36 and the conductive part 52, and is formed from the same material as that for the conductive part 52. The conductive parts 51 are a pair of conductive parts that is provided between the block insulating film 36 and the conductive part 52 of the memory pillar MP to sandwich the conductive part 50 along the Z direction, for example, and are dissimilar conductive part that is formed from a material different from that for the conductive parts 50 and 52.

The conductive part 52 has a seam SE1 extending in the Z direction between the adjacent memory pillars MP, for example. In this way, the seam SE1 is vertically formed in the semiconductor memory 1 according to the embodiment. The region of the seam SE1 may or may not contain an air gap.

The conductive part 52 has no seam formed in the region between the memory pillar MP and the slit SLT. An end portion EP of the conductive part 52 provided between the memory pillar MP and the slit SLT may or may not be in contact with the slit SLT portion. That is, the insulator 40 in the slit SLT may have a portion sandwiched between the upper insulating layer INS and the lower insulating layer INS.

Figure 6:
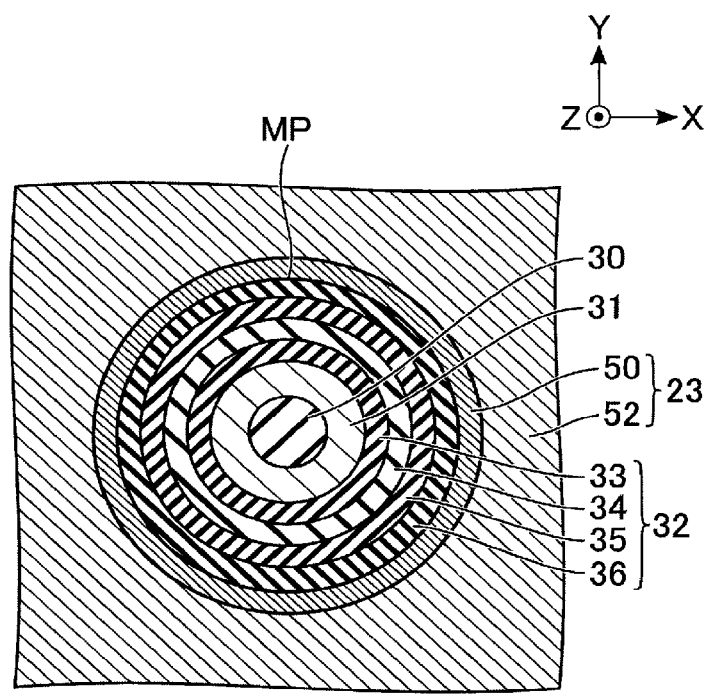
FIGS. 6, 7, and 8 are cross-sectional views of an example of a cross-section structure of a memory pillar included in the semiconductor memory according to the embodiment.
Figure 7:
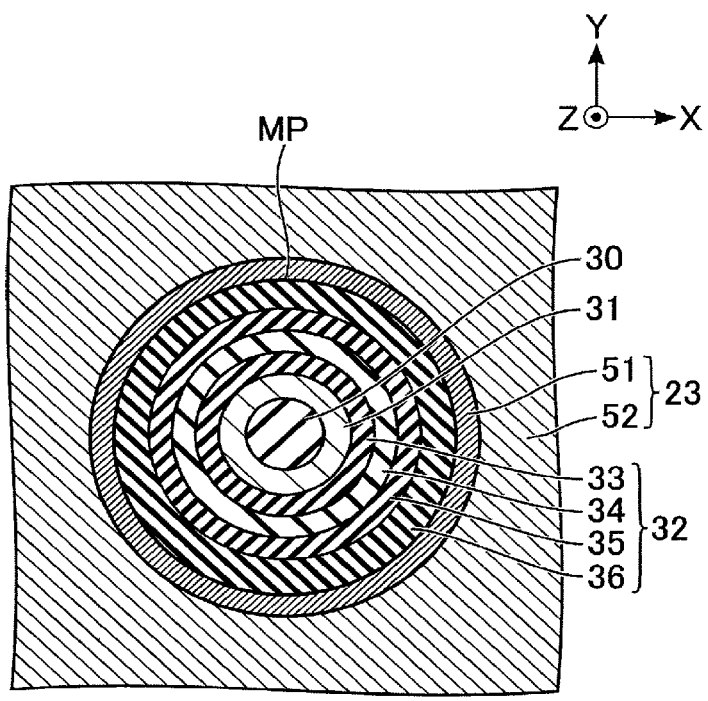
Figure 8:
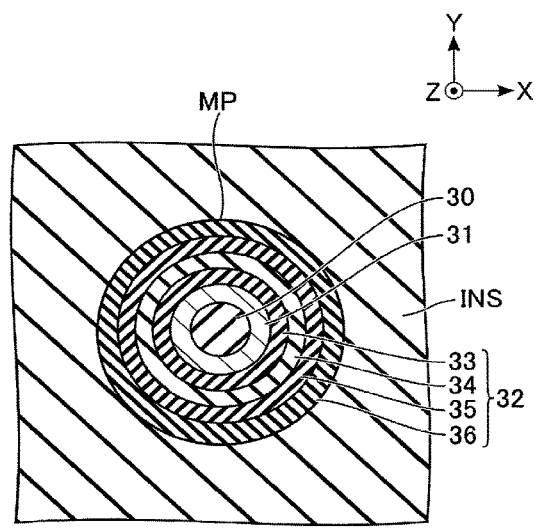

An example of a structure of the memory pillar MP in a cross section parallel to the surface of the semiconductor substrate 20 will be described below with reference to FIGS. 6, 7, and 8. FIG. 6 is a cross-sectional view of FIG. 5 taken along line VI-VI, illustrating an example of a cross-section structure of the memory pillar MP and the word line WL in the layer including the conductive part 50. FIG. 7 is a cross-sectional view of FIG. 5 taken along line VII-VII, illustrating an example of a cross-section structure of the memory pillar MP and the word line WL in the layer including the conductive parts 51. FIG. 8 is a cross-sectional view of FIG. 5 taken along line VIII-VIII, illustrating an example of a cross-section structure of the memory pillar MP in the layer including the insulating layer INS.

As illustrated in FIG. 6, the core member 30 in the layer including the conductive part 50 is provided in the center of the memory pillar MP. The semiconductor 31 surrounds the side surface of the core member 30. The tunnel oxide film 33 surrounds the side surface of the semiconductor 31. The insulating film 34 surrounds the side surface of the tunnel oxide film 33. The block insulating film 35 surrounds the side surface of the insulating film 34. The block insulating film 36 surrounds the side surface of the block insulating film 35. The conductive part 50 surrounds the side surface of the block insulating film 36. The conductive part 52 surrounds the side surface of the conductive part 50.

As illustrated in FIG. 7, the structure of the memory pillar MP in the layer including the conductive parts 51 is the same as the structure of the memory pillar MP described above with reference to FIG. 6. The conductive parts 51 surround the side surface of the block insulating film 36. The conductive part 52 surrounds the side surface of the conductive parts 51.

As illustrated in FIG. 8, the structure of the memory pillar MP in the layer including the insulating layers INS is the same as the structure of the memory pillar MP described above with reference to FIG. 6. The insulating layers INS surround the side surface of the block insulating film 36.

In the structure of the memory cell array 10 described above, the number of the conductors 23 is designed based on the number of the word lines WL. A plurality of conductors 22 provided on a plurality of layers may be assigned as select gate lines SGS. In the case where the select gate lines SGS are provided on the plurality of layers, conductors different from the conductors 22 may be used. A plurality of conductors 24 provided in a plurality of layers may be assigned as select gate lines SGD.

[1-2] Method of Manufacturing the Semiconductor Memory 1

FIGS. 9 to 26 illustrate an example of a cross-section structure of a structural body corresponding to the memory cell array 10 in a manufacturing process of the semiconductor memory 1 according to the first embodiment. An example of a series of manufacturing steps from formation of the source lines SL to formation of the insulator 40 in the slit SLT will be described below in sequence with reference to FIGS. 9 to 26.

Figure 9:
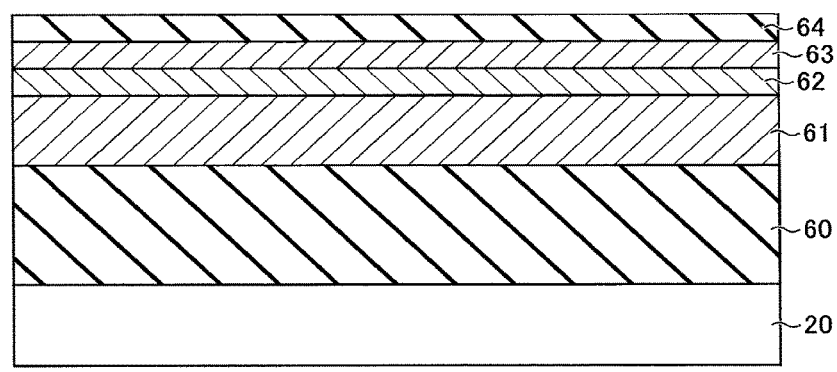

First, a stacked structure corresponding to the source line SL is formed as illustrated in FIG. 9. Specifically, an insulating layer 60 is formed on the semiconductor substrate 20. Although not illustrated, circuits such as the row decoder module 15 and the sense amplifier module 16 are formed in the insulating layer 60.

Then, a conductor 61, a sacrificial member 62, a conductor 63, and an insulating layer 64 are formed in sequence on the insulating layer 60. Each of the conductors 61 and 63 contains polysilicon (Si), for example. The material selected for the sacrificial member 62 is capable of increasing the etch selectivity for each of the conductors 61 and 63.

The wiring layer with the conductor 61, the sacrificial member 62, and the conductor 63 in this step has a set of conductors to be used as source line SL in a step described later.

Figure 10:
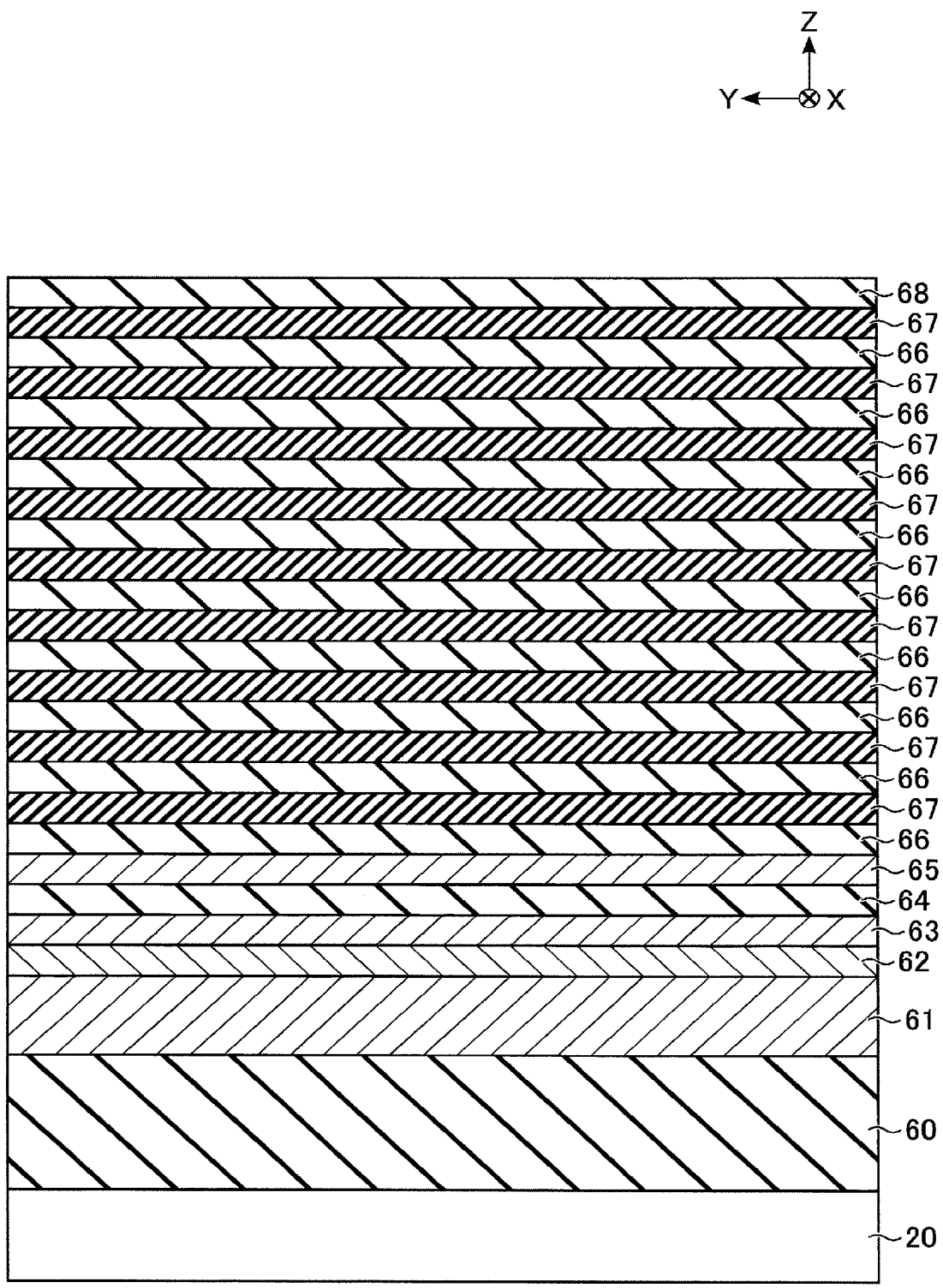

Next, a conductor 65 and a plurality of sacrificial members 67 are stacked as illustrated in FIG. 10. Specifically, the conductor 65 is formed on the insulating layer 64. Insulating layers 66 and the sacrificial members 67 are alternately stacked on the conductor 65. An insulating layer 68 is formed on the top sacrificial member 67.

The number of layers with the sacrificial members 67 corresponds to the number of layers of the word lines WL and the select gate lines SGD to be stacked, for example. The conductor 65 contains polysilicon (Si), for example. The conductor 65 corresponds to the conductor 22 described above with reference to FIG. 4, for example, and is used as select gate line SGS. Each of the insulating layers 66 and 68 contains silicon oxide ($SiO_2$), for example. The sacrificial members 67 contain silicon nitride (SiN), for example.

Figure 11:
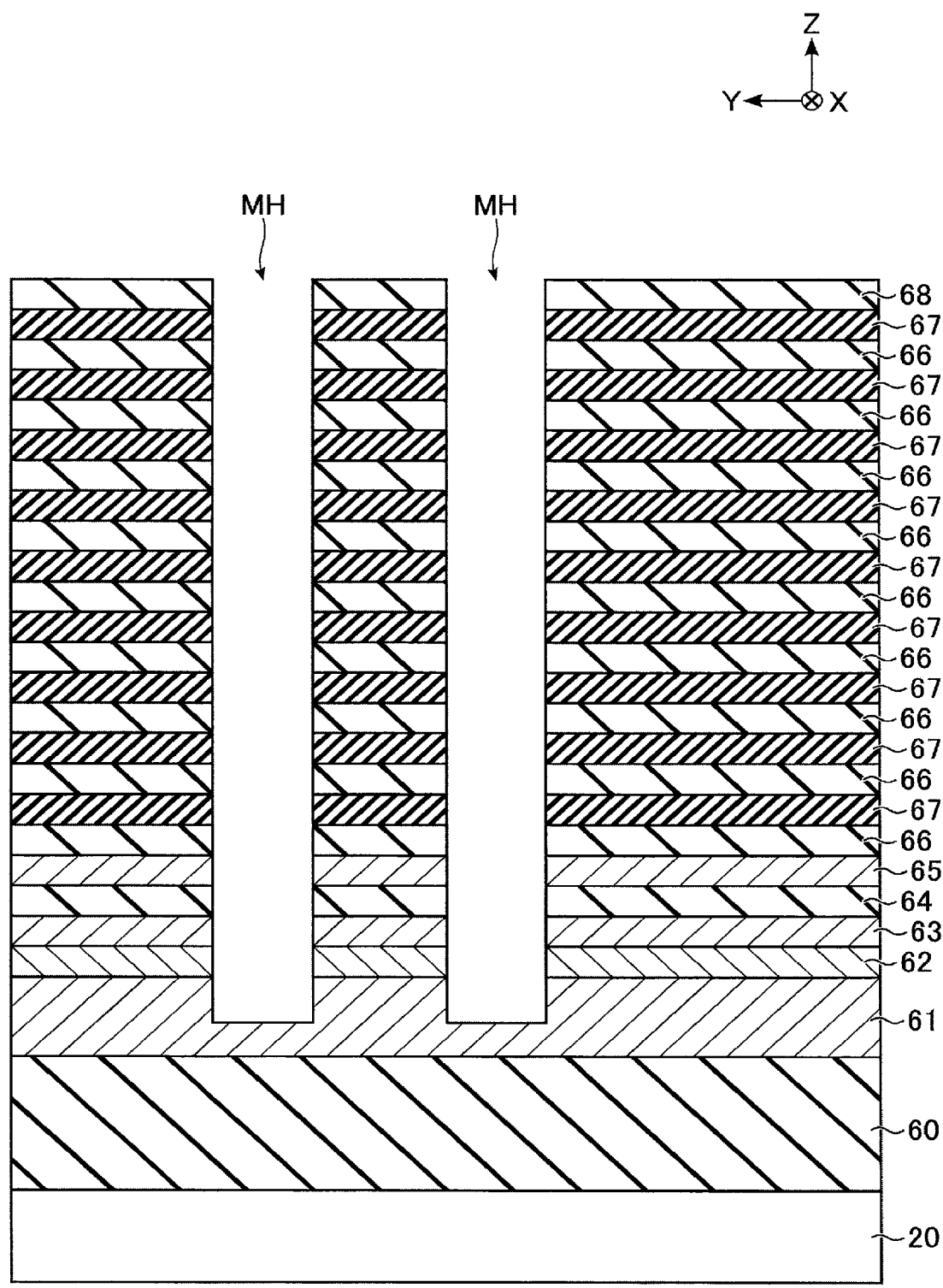

Next, memory holes MH are formed as illustrated in FIG. 11. Specifically, first, a mask with regions opened for formation of the memory pillars MP is formed on the insulating layer 68 by photolithography or the like. In addition, the formed mask is used to execute anisotropic etching to form the memory holes MH.

In the etching of this step, the memory holes MH penetrate through the insulating layer 68, the plurality of sacrificial members 67, the plurality of insulating layers 66, the conductor 65, the insulating layer 64, the conductor 63, and the sacrificial member 62. The bottom portions of the memory holes MH are stopped in the layer with the conductor 61, for example. The method of etching in this step is reactive ion etching (RIE), for example.

In the etching of this step, the conductor 65 may be used as an etching stopper. Using the conductor 65 as an etching stopper makes it possible to suppress excessive entry of the bottom portion of the memory hole MH into the conductor 61 and suppress fluctuation in the positions of the bottom portions of the plurality of memory holes MH.

Figure 12:
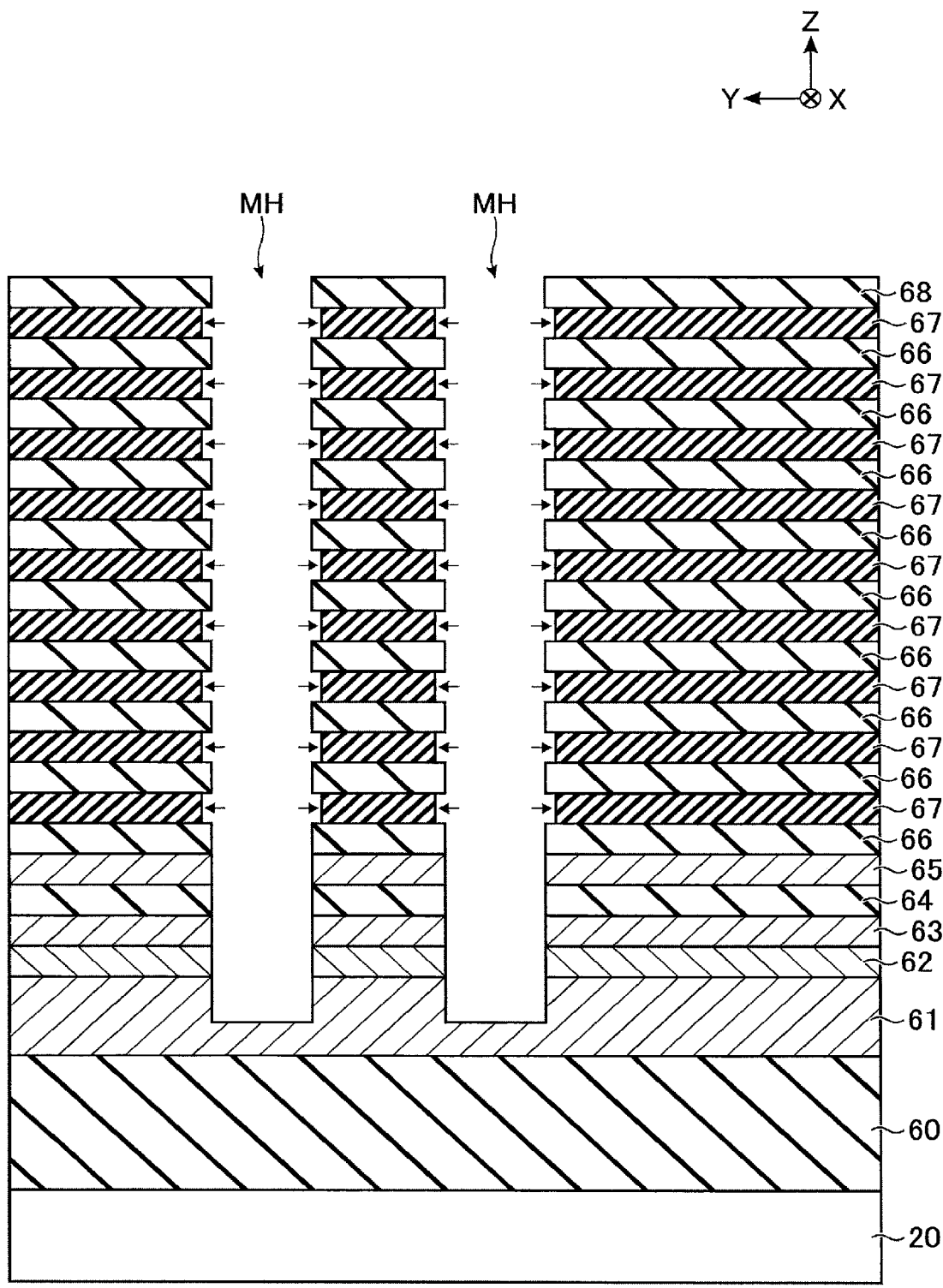

Next, the sacrificial members 67 are partially removed via the memory holes MH as illustrated in FIG. 12. The amount of removal of the sacrificial members 67 is adjusted such that the adjacent memory holes MH are not connected to each other via a space formed by removal of the sacrificial members 67, for example. In other words, the amount of removal of the sacrificial members 67 is adjusted such that the sacrificial members 67 provided between the adjacent memory holes MH are not completely removed.

The method of removing the sacrificial members 67 in this step is wet etching, for example. Hereinafter, the space formed by removal of the sacrificial members 67 in this step will be called concave portion HE of the memory hole MH.

Figure 14:
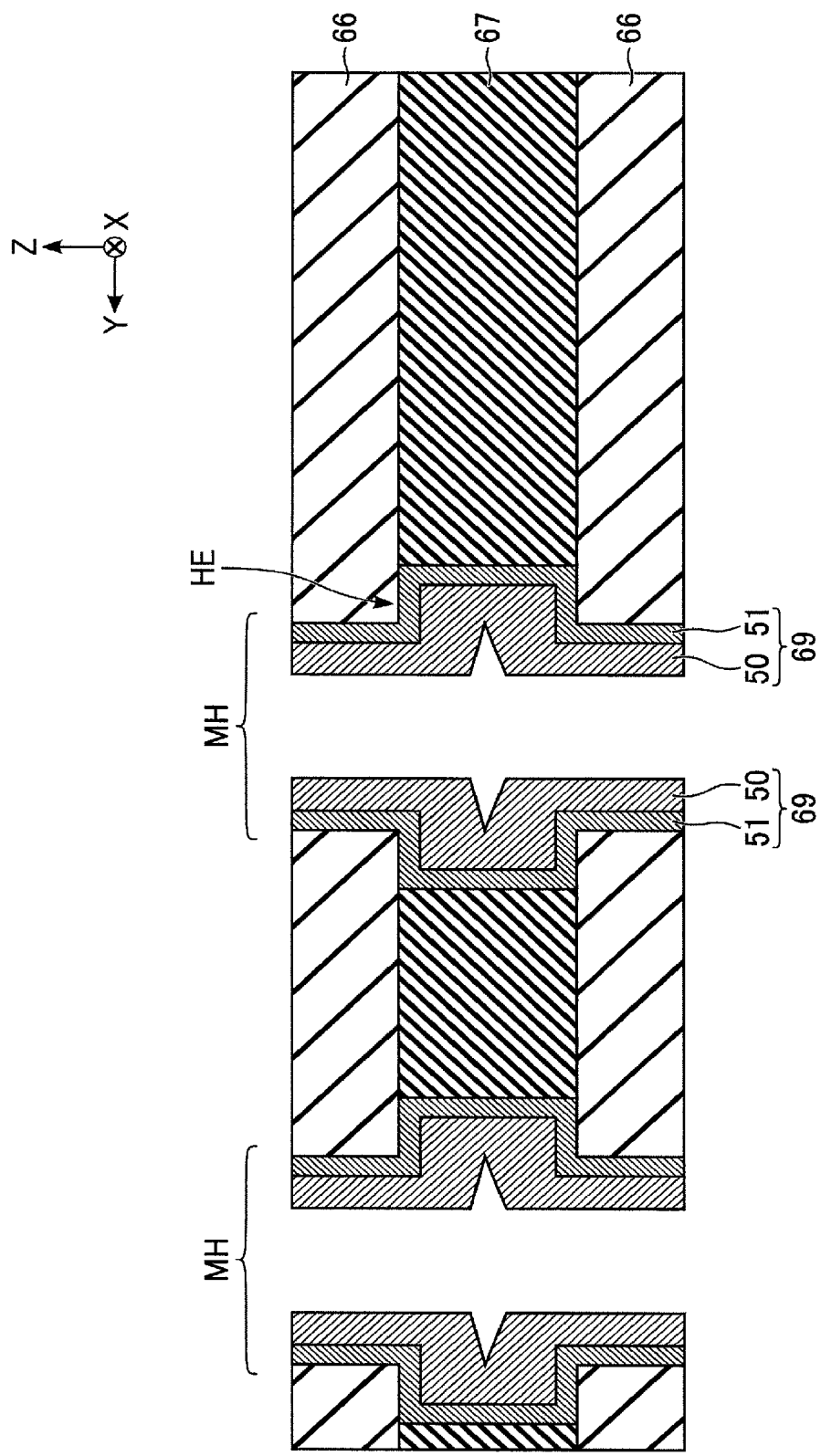
FIG. 14 is a more detailed cross-sectional view of the memory cell array, illustrating the example of the manufacturing process of the semiconductor memory according to the embodiment.

Next, a metal film 69 is formed in the memory holes MH and on the insulating layer 68 as illustrated in FIG. 13. The metal film 69 contains the conductive parts 50 and 51 as illustrated in FIG. 14. In this step, the conductive parts 51 and the conductive parts 50 are formed in sequence.

The conductive parts 51 are formed along the concave portions HE. Each of the conductive parts 50 formed in the concave portion HE in this step has a portion sandwiched between a portion of the conductive part 51 in contact with the upper insulating layer 66 and a portion of the conductive part 51 in contact with the lower insulating layer 66 out of the adjacent insulating layers 66.

In this step, the conductive parts 51 are used as barrier metal for formation of the conductive parts 50, for example. Specifically, at the formation of the conductive parts 50 (for example, tungsten), the conductive parts 51 suppress injection of impurities into the insulating layers 66 and the like to improve the adherence of the formed conductive parts 50, for example.

Figure 15:
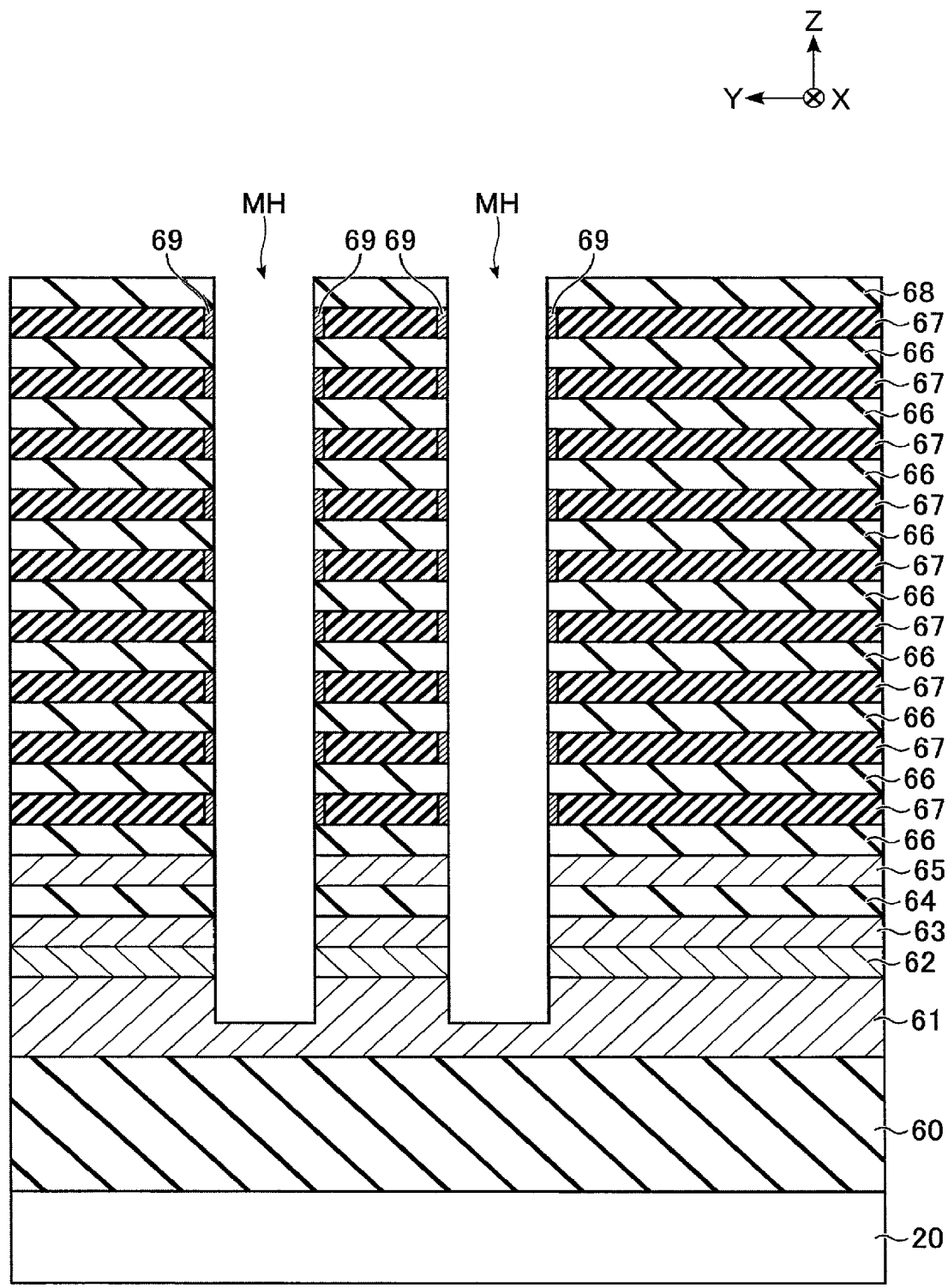
FIG. 15 is a cross-sectional view of the memory cell array, illustrating the example of the manufacturing process of the semiconductor memory according to the embodiment.
Figure 16:
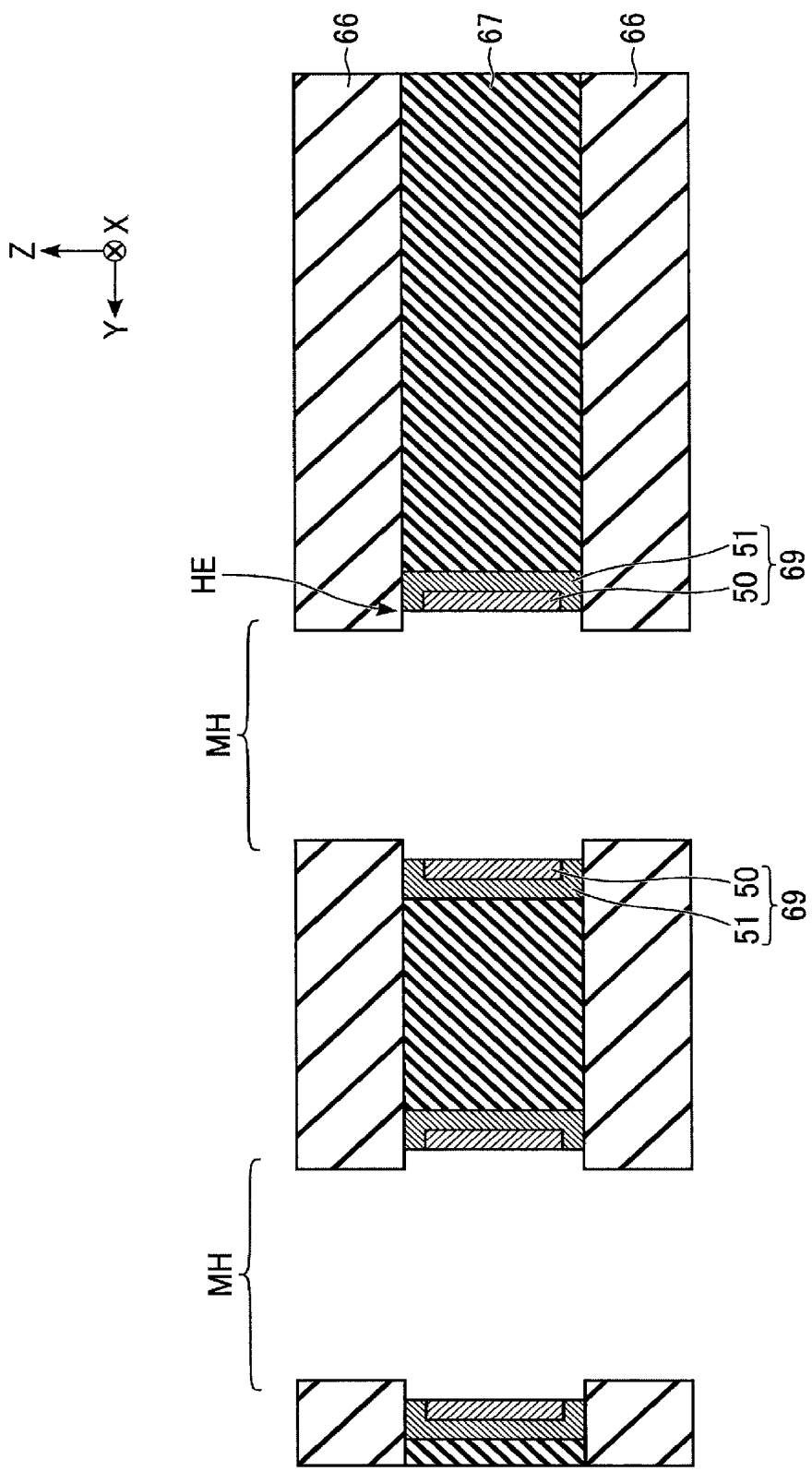
FIG. 16 is a more detailed cross-sectional view of the memory cell array, illustrating the example of the manufacturing process of the semiconductor memory according to the embodiment.

Next, the metal film 69 is removed from the memory holes MH and the insulating layer 68 except for part of the concave portions HE as illustrated in FIG. 15. The metal film 69 left in the concave portions HE contains the conductive parts 50 and 51 as illustrated in FIG. 16. For example, the distance between the surface of the metal film 69 exposed in the concave portion HE in this step and the center of the memory hole MH is wider than the distance between the surface of the insulating layer 66 in contact with the memory hole MH and the center of the memory hole MH.

Figure 17:
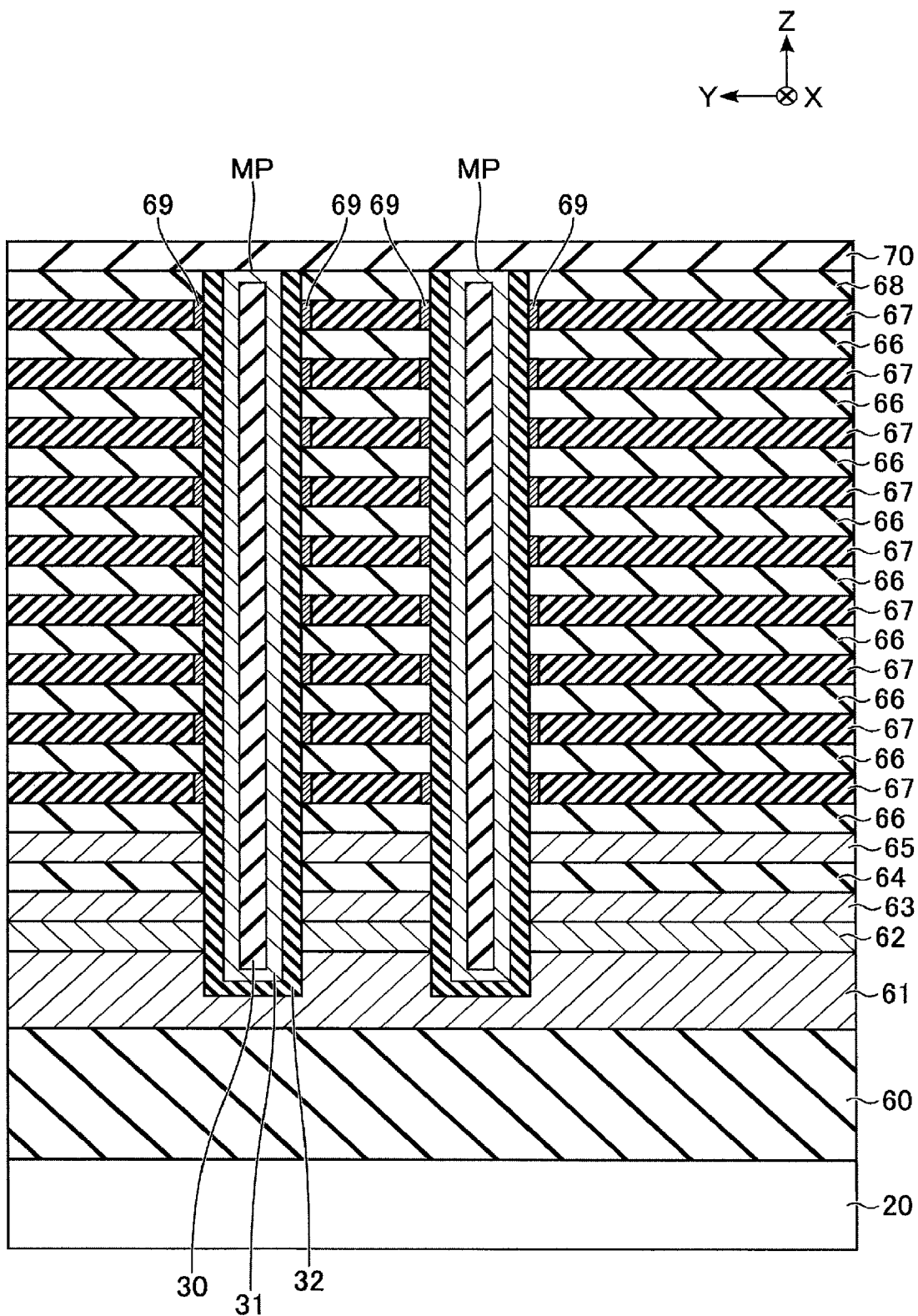
FIG. 17 is a cross-sectional view of the memory cell array, illustrating the example of the manufacturing process of the semiconductor memory according to the embodiment.

Next, the memory pillars MP are formed in the memory holes MH, and an insulating layer 70 is formed on the upper surface of the structural body formed on the semiconductor substrate 20 as illustrated in FIG. 17. Specifically, for example, the stacking film 32 (the block insulating films 36 and 35, the insulating film 34, and the tunnel oxide film 33), the semiconductor 31, and the core member 30 are formed in this order on the upper surface of the insulating layer 68 and the inner walls of the memory holes MH.

After that, the core member 30, the semiconductor 31, and the stacking film 32 are removed from the layer above the upper surface of the insulating layer 68, and the core member 30 is removed from the portions above the memory holes MH. The "portions above the memory holes MH" correspond to the portions included in the layer above the upper surface of the top sacrificial member 67. Then, the semiconductor 31 is formed in each of the memory holes MH in a region from which the core member 30 is removed, and the insulating layer 70 is formed on the upper surface of the structural body formed on the semiconductor substrate 20.

Figure 18:
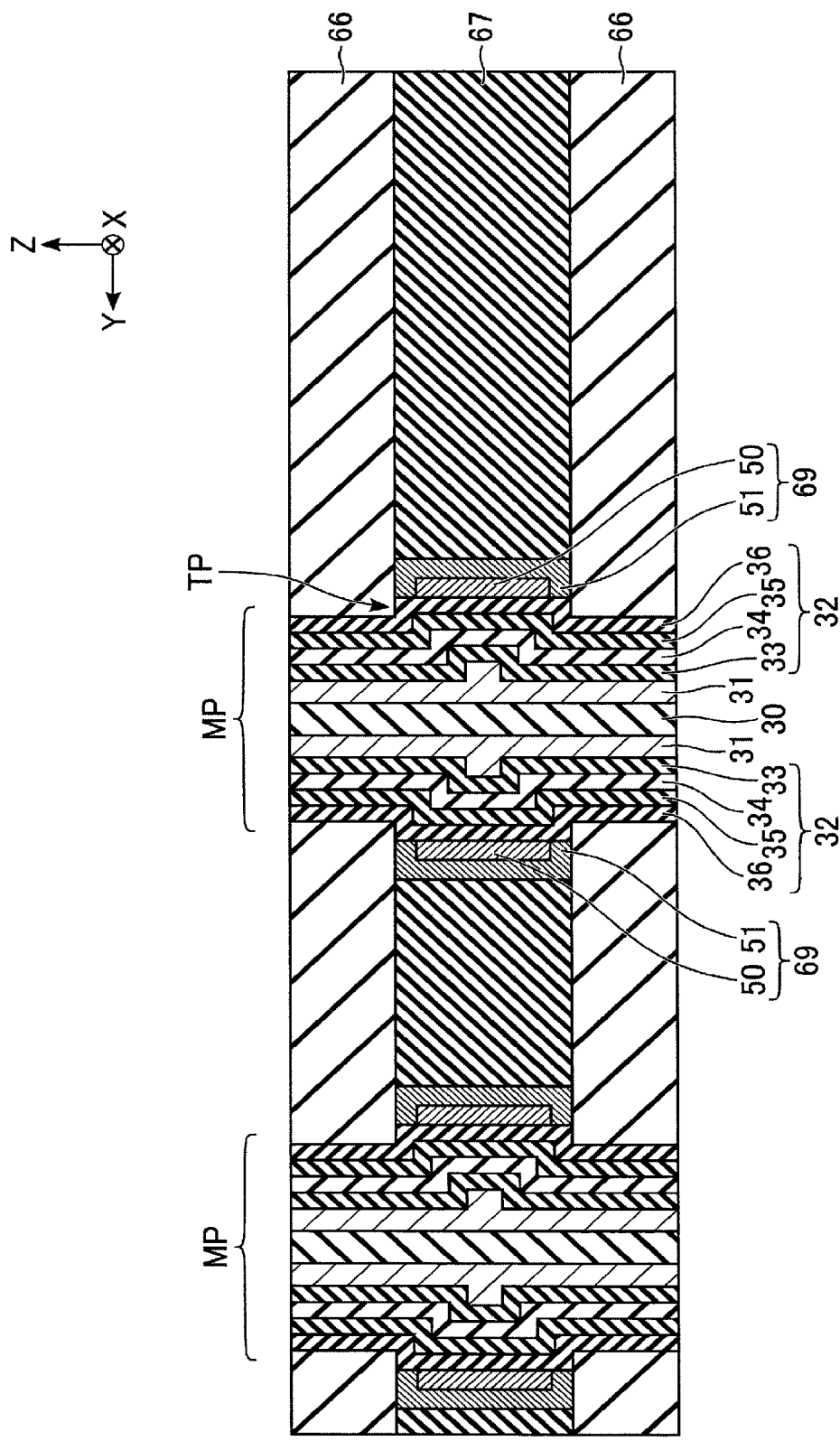
FIG. 18 is a more detailed cross-sectional view of the memory cell array, illustrating the example of the manufacturing process of the semiconductor memory according to the embodiment.

Each of the memory pillars MP formed in this step has the convex portion TP and the block insulating film 36 provided at the convex portion TP in contact with the metal film 69 as illustrated in FIG. 18.

Next, the slits SLT are formed as illustrated in FIG. 19. Specifically, first, a mask with regions opened for formation of the slits SLT is formed on the insulating layer 70 by photolithography or the like. In addition, the formed mask is used to execute anisotropic etching to form the slits SLT.

In the etching of this step, the slits SLT penetrate through the insulating layer 70, the insulating layer 68, the plurality of sacrificial members 67, the plurality of insulating layers 66, the conductor 65, the insulating layer 64, the conductor 63, and the sacrificial member 62. The bottom portions of the slits SLT are stopped in the layer with the conductor 61, for example. The bottom portions of the slits SLT reach at least the layer with the sacrificial member 62. The method of etching in this step is reactive ion etching (RIE), for example.

Next, the sacrificial member 62 is selectively removed by etching via the slits SLT as illustrated in FIG. 20. Subsequently, the stacking films 32 provided on the side surface of the memory pillars MP are partially removed via the region from which the sacrificial member 62 is removed.

As a result, the semiconductors 31 in the memory pillars MP are exposed in the layer from which the sacrificial member 62 is removed. The method of removing the sacrificial member 62 in this step is wet etching using a water solution with selectivity of the sacrificial member 62 larger than selectivity of the conductors 61 and 63, for example.

Next, a conductor 71 is formed as illustrated in FIG. 21. Specifically, the conductor 71 is formed by chemical vapor deposition (CVD), for example, in the space from which the sacrificial member 62 is removed, and then is etched back.

As a result, the semiconductor 31 in each of the memory pillars MP and a set of the conductors 61, 71, and 63 are electrically connected together. The set of the conductors 61, 71, and 63 corresponds to the conductor 21 described above with reference to FIG. 4, for example, and is used as source line SL. As the conductor 71, polysilicon doped with phosphorous is formed, for example.

Next, the sacrificial members 67 are removed as illustrated in FIG. 22. Specifically, first, the surfaces of the conductors 61, 71, 63, and 65 (for example, polysilicon) exposed in the slits SLT are oxidized to form an oxide protective film not illustrated.

Then, the sacrificial members 67 are removed by wet etching with hot phosphoric acid, for example. The three-dimensional structure of the structural body from which the sacrificial members 67 were removed is maintained by the plurality of memory pillars MP, for example.

Figure 23:
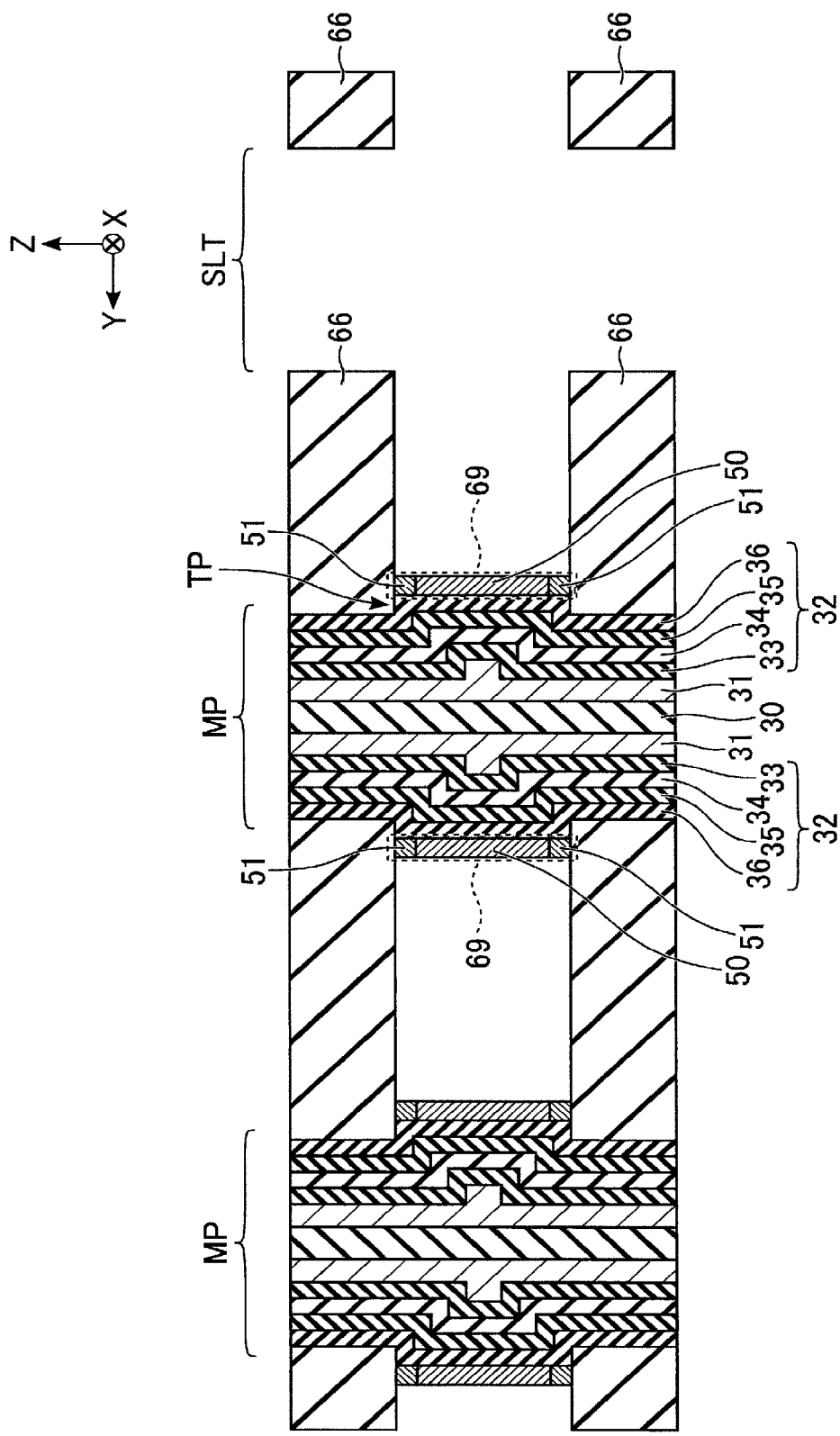
FIG. 23 is a more detailed cross-sectional view of the memory cell array, illustrating the example of the manufacturing process of the semiconductor memory according to the embodiment.

In this step, the metal film 69 is partially removed by etching via the slits SLT as illustrated in FIG. 23. Specifically, on the metal film 69 near the convex portions TP, the conductive parts 51 are partially removed via the regions from which the sacrificial members 67 were removed to expose the conductive parts 50.

Figure 25:
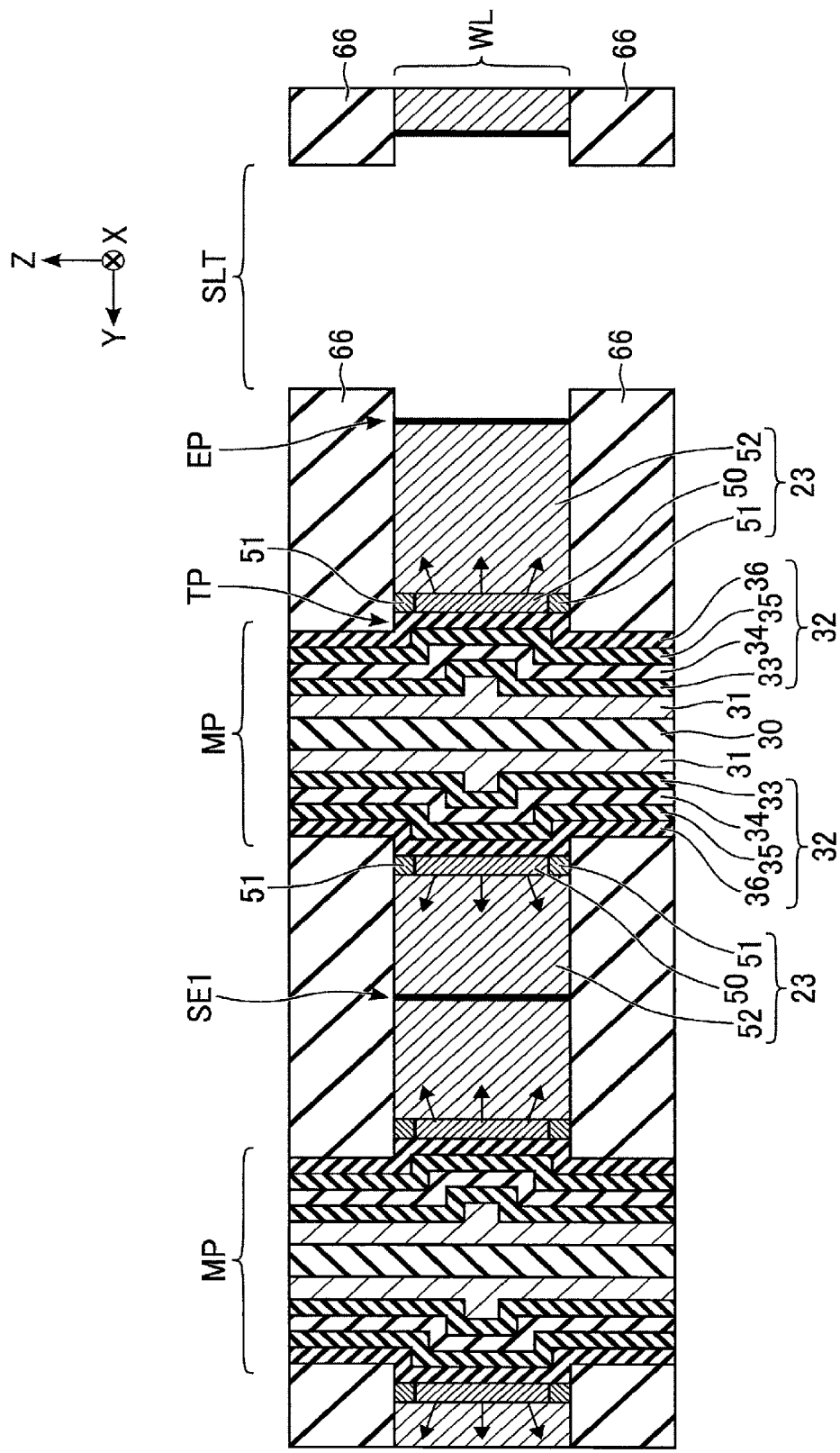
FIG. 25 is a more detailed cross-sectional view of the memory cell array, illustrating the example of the manufacturing process of the semiconductor memory according to the embodiment.

Next, the conductive parts 52 are formed in the spaces from which the sacrificial members 67 were removed as illustrated in FIG. 24. Specifically, the metal material included in the conductive parts 50 is selectively grown (re-grown) by selective chemical vapor deposition (CVD), for example, as illustrated in FIG. 25. As a result, the conductive parts 52 grow from the surfaces of the conductive parts 50 to form the conductive parts 52.

In this step, each of the conductive parts 52 is in contact between the adjacent memory pillars MP, for example, and is grown such that the end portion EP of the conductive part 52 reaches the vicinity of the slit SLT. The position of the end portion EP of the conductive part 52 can be designed to an arbitrary position as far as the end portion EP at least does not cause a short-circuit between the conductive parts 52 provided on the adjacent wiring layers.

As described above, the conductive parts 52 are metal wires formed by re-growing the conductive parts 50. The conductive parts 50 and the conductive parts 52 are formed by different methods and thus may be different in grain size. Boundaries between the conductive part 50 and the conductive part 52 can be formed. The sets of the conductive parts 50 to 52 formed in the plurality of wiring layers in this step are used as word lines WL or select gate line SGD, for example.

Figure 26:
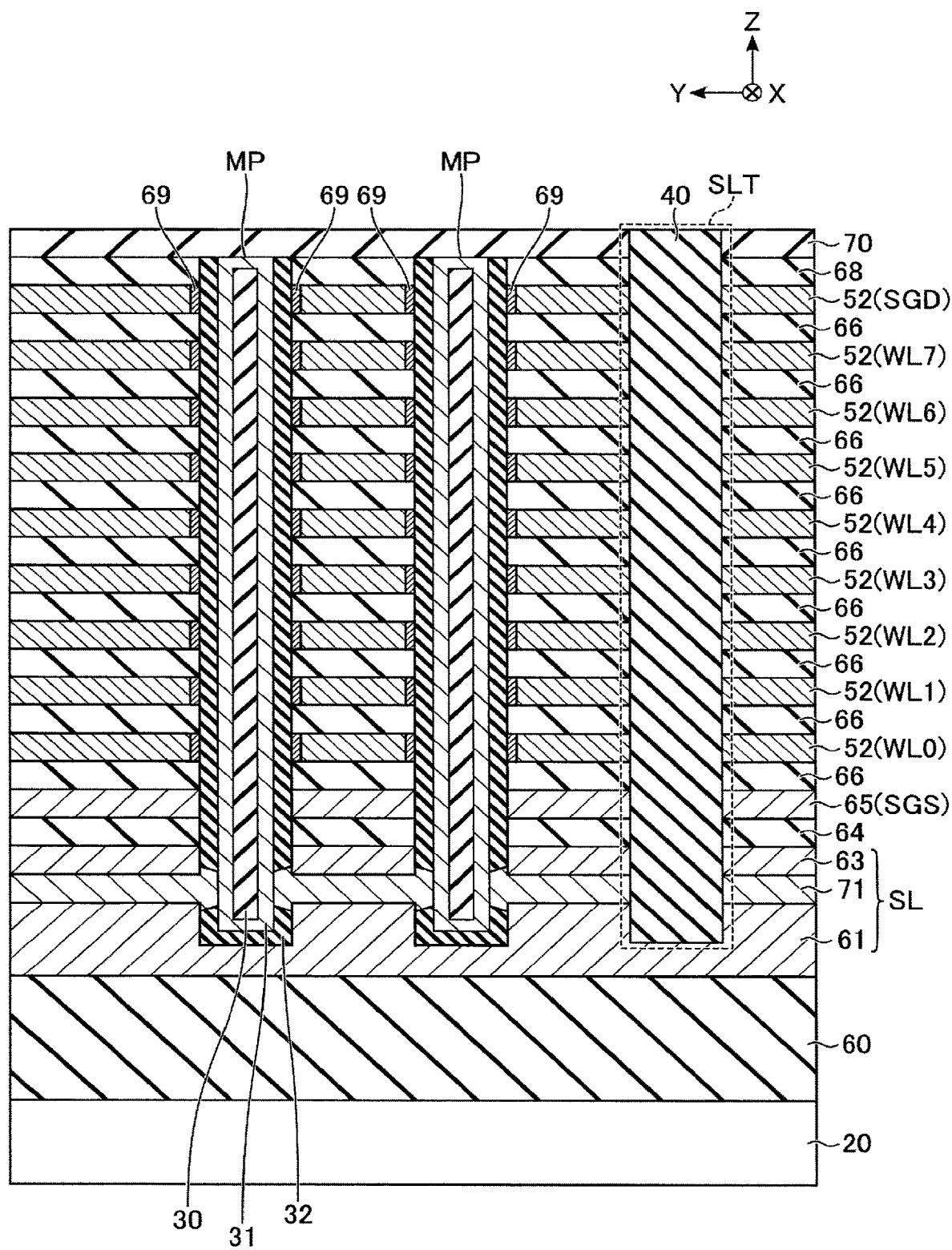
FIG. 26 is a cross-sectional view of the memory cell array, illustrating the example of the manufacturing process of the semiconductor memory according to the embodiment.

Next, the insulators 40 are formed in the slits SLT as illustrated in FIG. 26. In this step, before the insulators 40 are embedded in the slits SLT, silicon nitride or the like may be formed as side walls of the slits SLT.

In the manufacturing steps described above, the NAND strings NS, the source line SL and the select gate lines SGS and SGD, and the word lines WL connected to the NAND strings NS are formed. Hereinafter, a process for replacing the sacrificial members 67 with the conductive part 52 will be called wiring replacement process, for example.

The manufacturing steps described above are a mere example and other steps may be inserted into the manufacturing steps. For example, when the selectivity for selectively forming the conductive parts 52 is small, an etch back step may be inserted after the steps described above with reference to FIGS. 24 and 25 to remove the metal or the like that could have been formed in the slits SLT.

[1-3] Advantageous Effects of the Embodiment

According to the semiconductor memory 1 in the embodiment, it is possible to reduce a resistance value of the word line WL in the semiconductor memory 1. Hereinafter, the advantageous effects of the semiconductor memory 1 in the embodiment will be described in detail with reference to a comparative example.

Figure 27:
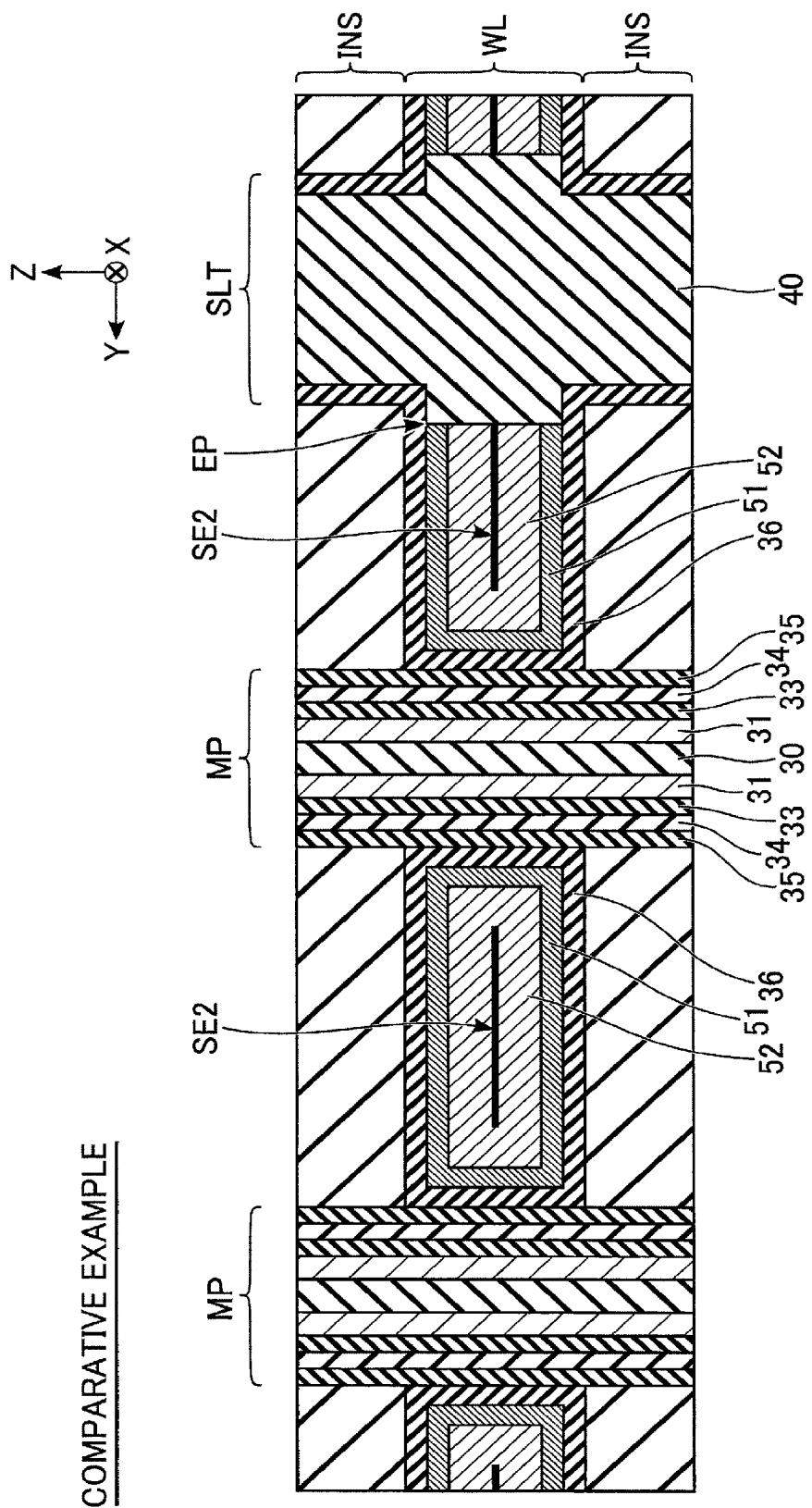
FIG. 27 is a cross-sectional view of an example of a cross-section structure of a memory cell array included in a semiconductor memory according to a comparative example of the embodiment.

FIG. 27 illustrates an example of a cross-section structure of a memory cell array included in a semiconductor memory according to the comparative example of the embodiment. As illustrated in FIG. 27, the cross-section structure of the memory cell array in the comparative example is different from the cross-section structure of the memory cell array 10 in the embodiment in the structures of the memory pillars MP and the slits SLT and in the structure of the conductors corresponding to the word lines WL.

Specifically, in the semiconductor memory according to the comparative example, the block insulating films 36 and the conductive parts 51 are formed in the wiring replacement process, not at the time of formation of the memory pillars MP. Accordingly, the block insulating films 36 are omitted from the memory pillars MP in the comparative example, unlike the memory pillars MP in the embodiment.

In the semiconductor memory according to the comparative example, the conductive parts 51 are formed in the wiring replacement process using the slits SLT, and the process for forming the concave portions HE in the memory holes MH and leaving the metal film 69 in the concave portions HE is not performed unlike in the embodiment, for example. Accordingly, the memory pillars MP in the comparative example do not have the convex portions TP that are included in the memory pillars MP in the embodiment, for example.

In addition, the conductive parts 52 in the semiconductor memory in the comparative example are formed on the surfaces of the barrier metal (the conductive parts 51) by chemical vapor deposition (CVD), for example, and a lateral seam SE2 is formed instead of the vertical seam SE1 in the embodiment. In the comparative example, the seam SE2 is formed not only between the adjacent memory pillars MP but also between the memory pillar MP and the slit SLT. The seam SE2 formed between the memory pillar MP and the slit SLT is in contact with the insulator 40 formed in the slit SLT, for example.

Figure 28:
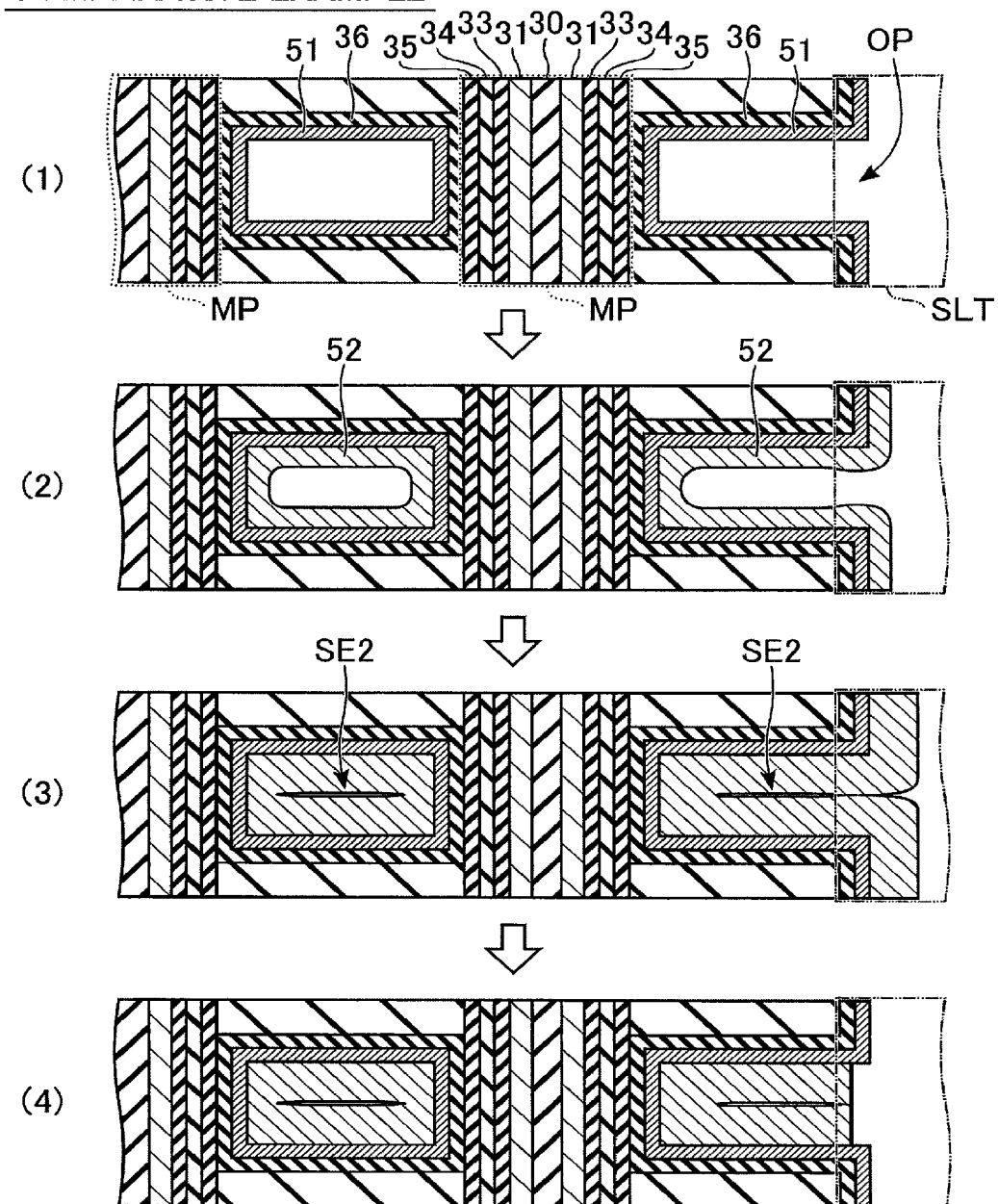
FIG. 28 is a diagram illustrating an example of a formation process of stacking wires in the semiconductor memory according to the comparative example of the embodiment.

FIG. 28 illustrates an example of a process of formation of the conductive parts 52 in the wiring replacement process using the slit SLT in the semiconductor memory according to the comparative example of the embodiment. Hereinafter, a portion from which the sacrificial members 67 are removed and that is in contact with the slit SLT will be called opening portion OP.

As illustrated in FIG. 28(1), in the comparative example, after the removal of the sacrificial members 67, the block insulating films 36 and the conductive parts 51 are formed in sequence. Subsequently, the conductive parts 52 are formed. In this step, the conductive parts 52 are formed on the surfaces of the conductive parts 51 as illustrated in FIG. 28(2).

As the step proceeds, the entire spaces where the sacrificial members 67 were once formed are filled with the grown conductive parts 52, for example, as illustrated in FIG. 28(3). After that, the conductive parts 52 are removed from the slit SLT by etching, and the conductive parts 52 adjacent in the stacking direction are electrically insulated as illustrated in FIG. 28(4).

In the process of formation of the conductive parts 52 described above, the conductive parts 52 grown from the upper side and the lower side are in contact with each other at the opening portion OP to close the opening portion OP, and the growth of the conductive parts 52 is stopped inside the memory cell array.

In the comparative example, for example, in the wiring replacement process, the opening portion OP is closed before the conductive parts 52 are embedded between the memory pillars MP to produce the possibility of imperfect embedding of the conductive parts 52 between the memory pillars MP. When the embedding of the conductive parts 52 becomes imperfect, there is a possibility that the volume of the conductive parts 52 to be formed will reduce to raise a wiring resistance.

In contrast, in the semiconductor memory 1 according to the embodiment, before the execution of the wiring replacement process using the slit SLT, the sacrificial members 67 are partially removed using the memory holes MH to form the conductive parts 50 and 51. Then, the memory pillars MP including the block insulating film 36 are formed, and after the formation of the slits SLT, the selective growth of the conductive parts 52, that is, the re-growth of the conductive parts 50 is executed.

FIG. 29 illustrates an example of a process of formation of the conductive parts 52 in the wiring replacement process using the slit SLT in the semiconductor memory 1 according to the embodiment.

As illustrated in FIG. 29(1), in the embodiment, when the sacrificial members 67 are removed via the slit SLT, the conductive parts 50 and 51 are formed between the opening portion OP and the block insulating film 36 of the memory pillar MP.

In the embodiment, the conductive parts 52 are formed by selectively growing (re-growing) a metal material included in the conductive parts 50. Accordingly, in this step, the conductive parts 52 grow laterally from the surfaces of the conductive parts 50 as illustrated in FIG. 29(2). In the process of growth, the conductive parts 52 are in contact with the insulating layers adjacent to the wiring layers.

As the process proceeds, the grown conductive part 52 reaches near the opening portion OP, for example, and the conductive parts 52 grown between the adjacent memory pillars MP are in contact with each other, as illustrated in FIG. 29(3). Accordingly, in the embodiment, the entire spaces where the sacrificial members 67 were once formed are filled with the grown conductive parts 52, for example.

In this manner, in the semiconductor memory 1 according to the embodiment, the conductive parts 52 are formed by selective growth. Accordingly, in this step, it is possible to suppress the formation of the conductive parts 52 on the side surface portions of the slits SLT or the surface of the structural body formed on the semiconductor substrate 20.

As described above, in the semiconductor memory 1 according to the embodiment, the sacrificial members 67 are partially replaced with the conductive parts 50 via the memory holes MH to allow the use of selective growth as a method of forming the conductive parts 52 via the slits SLT.

In addition, in the semiconductor memory 1 according to the embodiment, the use of selective growth does not allow the opening portion OP to be closed at the formation of the conductive parts 52 as in the comparative example, thereby achieving improvement in the embedding property of the conductive parts 52.

Further, in the semiconductor memory 1 according to the embodiment, at the execution of the wiring replacement process using the slits SLT, the block insulating films 36 and the conductive parts 51 are not formed to make the volume of the conductive parts 52 formed between the adjacent insulating layers larger than that in the semiconductor memory according to the comparative example.

As a result, the semiconductor memory 1 according to the embodiment suppresses an increase in the wiring resistance of the stacking wires provided in the memory cell array 10 and reduces the resistance value of the word lines, for example. In addition, the semiconductor memory 1 according to the embodiment suppresses power consumption with a decrease in the wiring resistance.

For example, the resistance value of the conductive parts 51 (for example, titanium nitride TiN) is higher than the resistance value of the conductive parts 52 (for example, tungsten W). Accordingly, even in the case where the block insulating films 36 are included in the memory pillars MP in the comparative example, the semiconductor memory 1 according to the embodiment has the low-resistance conductive parts 52 larger in volume than those in the comparative example to make the wiring resistance of the word lines WL and the like lower than that in the comparative example.

Other advantageous effects of the semiconductor memory 1 according to the embodiment will be listed below.

In the comparative example described above, in the etching process in which to remove the sacrificial members corresponding to the word lines WL via the slits SLT, the time during which the block insulating films 35 are immersed in an etching solution varies depending on the distance from the slit SLT. Specifically, the timing at which the sacrificial members are removed from a region distant from the slit SLT (for example, the region between the memory pillars MP) is lagged behind the timing at which the sacrificial members near the slit SLT are removed.

As a result, the time during which the block insulating films 35 formed near the slit SLT are immersed in an etching solution becomes longer than the time during which the block insulating films 35 formed in the region distant from the slit SLT are immersed in an etching solution. In the step of removing the sacrificial members, the etching solution is selected such that the etch selectivity of the sacrificial members is higher than that of the block insulating films 35. However, depending on the length of the time for immersion in the etching solution and the etch selectivity, the thickness of the block insulating films 35 may vary corresponding to the distance from the slit SLT.

In contrast to this, in the semiconductor memory 1 according to the embodiment, the block insulating films 36 are formed in the memory holes MH. Further, at the formation of the conductive parts 52 using the slits SLT, the block insulating films 36 are surrounded by the single-annular conductive parts 50 and 51 (the metal films 69) as illustrated in FIGS. 6 and 7 and thus the side surfaces of the block insulating films 36 are not immersed in the etching solution.

Accordingly, in the semiconductor memory 1 according to the embodiment, it is possible to suppress variations in the thicknesses of the block insulating films 35 and 36 included in the plurality of memory pillars MP as compared to the semiconductor memory according to the comparative example.

As a result, the semiconductor memory 1 according to the embodiment can suppress characteristic variations among the memory pillars MP as compared to the semiconductor memory according to the comparative example, thereby improving the reliability of data stored in the semiconductor memory 1.

FIG. 30 illustrates an example of an electric field applied to the memory pillar MP at the time of a writing action of the semiconductor memory 1. As illustrated in FIG. 30, in the semiconductor memory 1 according to the embodiment, the convex portions CV can be formed on the semiconductor 31 in the layer with the word line WL.

For example, when a high voltage is applied to the word line WL at the time of a writing action, an electric field can concentrate on the convex portions CV of the semiconductor 31. When electric field concentration occurs as illustrated in the drawing, the potential difference between the channel and the charge accumulation layer (the insulating film 34) in the corresponding memory cell transistor MT becomes larger. As a result, in the semiconductor memory 1 according to the embodiment, it is possible to improve the writing efficiency and increase the speed of a writing action.

[1-4] Modification Example of the Embodiment

In the semiconductor memory 1 according to the embodiment described above, in the manufacturing process described with reference to FIG. 23, the etch selectivity of the water solution used for the removal of the sacrificial members 67 is higher in the conductive parts 51 than in the conductive parts 50, and thus the conductive parts 51 may not be left, for example. A structure and advantageous effects of a semiconductor memory 1 according to a modification example of the embodiment will be described below.

Figure 31:
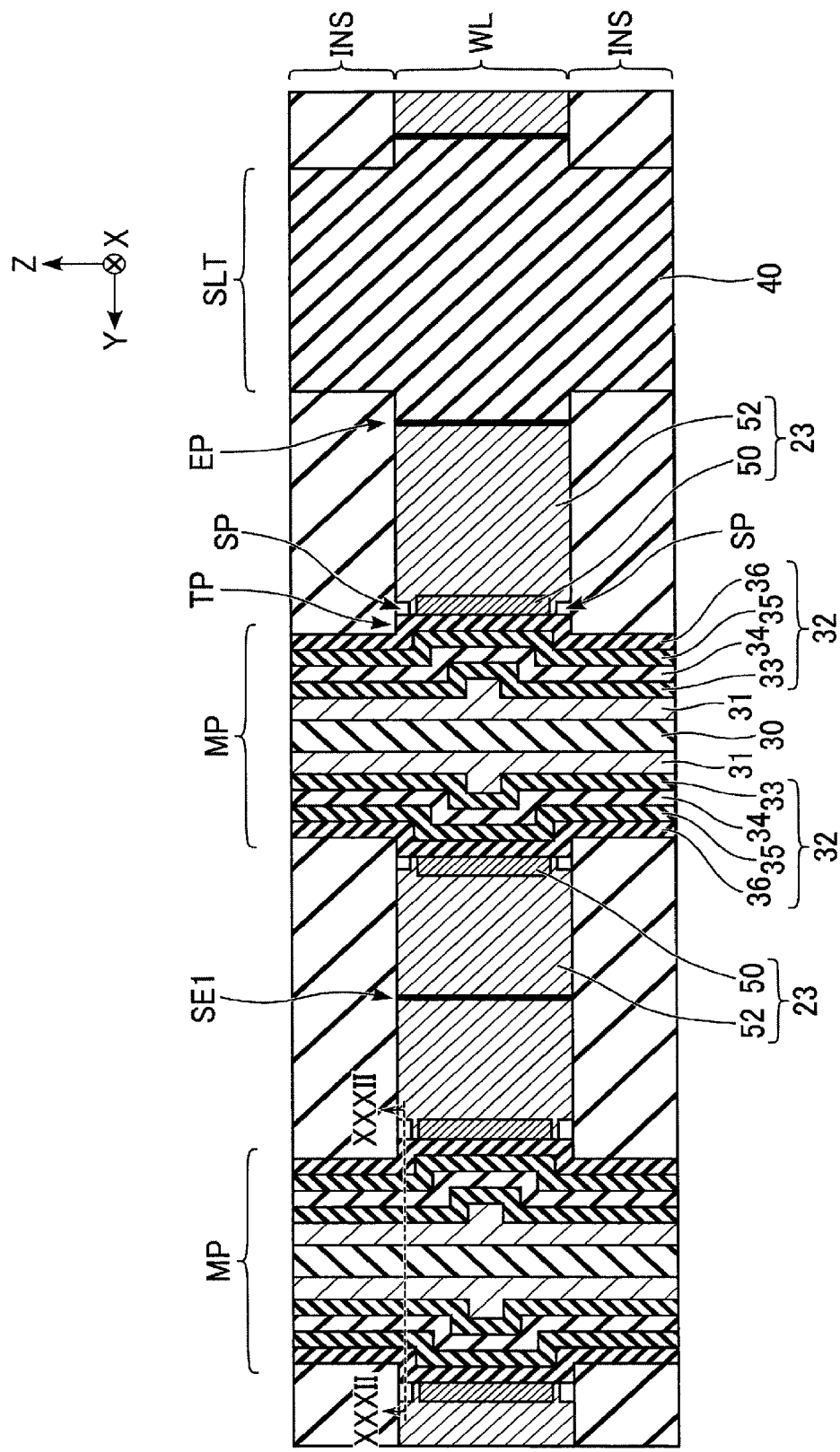
FIG. 31 is a cross-sectional view of an example of a cross-section structure of a memory cell array included in a semiconductor memory according a modification example of the embodiment.

FIG. 31 illustrates an example of a cross-section structure of a memory cell array 10 included in the semiconductor memory 1 according to the modification example of the embodiment. As illustrated in FIG. 31, the memory cell array 10 in the modification example is structured without the conductive parts 51 as compared to the cross-section structure of the memory cell array 10 in the embodiment.

For example, spaces (cavities) SP are provided in regions without the conductive parts 51. The spaces SP are in contact with the convex portions TP of the memory pillar MP. In other words, the spaces SP are a pair of spaces SP that is provided to sandwich the conductive part 50 along the Z direction, for example, between the block insulating film 36 in the memory pillar MP and the conductive part 52. That is, the spaces SP are included in portions between the block insulating film 36 in the memory pillar MP and the conductive part 52. The size of the spaces SP varies depending on the size of the region with the conductive part 52. The spaces SP may also be called air gaps.

In this manner, in the semiconductor memory 1 according to the modification example of the embodiment, the spaces SP are provided near the outer periphery of the memory pillar MP. In a cross section parallel to the surface of the semiconductor substrate 20 and including the space SP, the distance between the center of the memory pillar MP and the portion of the space SP in contact with the memory pillar MP that is most distant from the memory pillar MP is shorter than half the distance (MP pitch) between the centers of the adjacent memory pillars MP.

FIG. 32 is a cross-sectional view of FIG. 31 taken along line XXXII-XXXII, illustrating an example of a structure of the memory pillar MP in the cross section parallel to the surface of the semiconductor substrate 20 and including the space SP.

As illustrated in FIG. 32, the structure of the memory pillar MP in the layer including the space SP is similar to the structure of the memory pillar MP described with reference to FIG. 6. The space SP surrounds the side surface of the block insulating film 36. The conductive part 52 surrounds the space SP. In other words, the space SP is provided between the conductive part 52 and the block insulating film 36.

Figure 33:
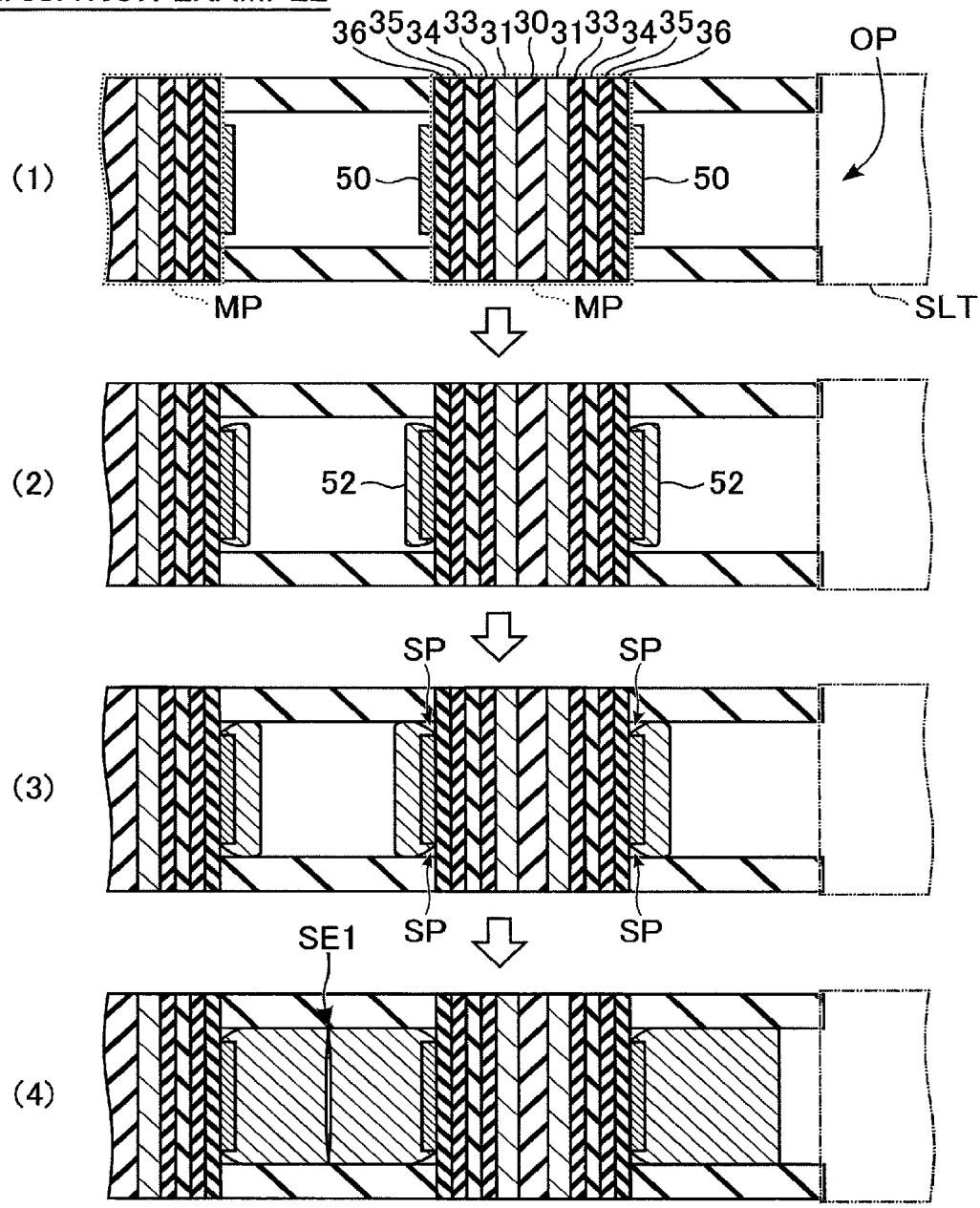
FIG. 33 is a diagram illustrating an example of a formation process of stacking wires in the semiconductor memory according to the modification example of the embodiment.

FIG. 33 illustrates an example of a process of formation of the conductive parts 52 in the wiring replacement process using the slit SLT in the semiconductor memory 1 according to the modification example of the embodiment.

As illustrated in FIG. 33(1), in the modification example of the embodiment, the conductive parts 51 are also removed at the time of removal of the sacrificial members 67 via the slit SLT. This can occur by lengthening the time for etching in this step, for example.

Next, the selective growth of the conductive parts 52 is executed based on a metal material included in the conductive parts 50. In this step, the conductive parts 52 re-grow from the side surfaces of the conductive parts 50 as illustrated in FIG. 33(2). In the process of the re-growth, the conductive parts 52 are also formed in the spaces where the conductive parts 51 would be formed in the embodiment.

The speed of formation of the conductive parts 52 varies depending on the ease of attachment of a gas supplied via the slit SLT. Accordingly, as illustrated in FIG. 33(3), the grown conductive parts 52 are in contact with the insulating layers adjacent to the wiring layers to form the spaces SP. In the subsequent steps, no gas is supplied to the spaces SP and thus the re-growth process proceeds with the spaces SP left.

As the process proceeds, the grown conductive part 52 reaches near the opening portion OP, for example, and the grown conductive parts 52 between the adjacent memory pillars MP are in contact with each other as illustrated in FIG. 33(4). Accordingly, in the modification example of the embodiment, the spaces where the sacrificial members 67 were once formed are filled with the grown conductive parts 52 and the spaces SP are left on the side surfaces of the memory pillars MP, for example.

In the semiconductor memory 1 according to the modification example of the embodiment described above, the volume of the conductive parts 52 is larger than that in the semiconductor memory 1 according to the embodiment, for example. Since the resistance value of the conductive parts 52 is lower than that of the conductive parts 51, the semiconductor memory 1 according to the modification example of the embodiment allows the wiring resistance of the word lines WL and others to be reduced as compared to that in the semiconductor memory 1 according to the embodiment.

In addition, the spaces SP adjacent to the memory pillars MP are effective in suppressing a fringe effect. Therefore, the semiconductor memory 1 according to the modification example of the embodiment can suppress interference between the adjacent memory cell transistors MT to improve the reliability of data stored.

The conductive parts 51 are completely removed from the semiconductor memory 1 according to the modification example of the embodiment described above, but the semiconductor memory 1 is not limited to this. For example, in the semiconductor memory 1 according to the modification example of the embodiment, the conductive parts 51 may be left near the spaces SP.

[2] OTHER MODIFICATION EXAMPLES

A semiconductor memory according to an embodiment includes a first conductor, a first insulator and a plurality of memory pillars. The first conductor and the first insulator are alternately stacked along a first direction. The plurality of memory pillars penetrates through the stacked first conductor and first insulator. Each of the memory pillars include a semiconductor along the first direction, a tunnel insulating film that surrounds a side surface of the semiconductor, a second insulator that surrounds a side surface of the tunnel insulating film, and a block insulating film that surrounds a side surface of the second insulator. The memory pillars include a first memory pillar. The stacked first insulator includes a first layer and a second layer that are adjacent to each other in the first direction. The first conductor between the first layer and the second layer includes a first conductive part, a second conductive part, and a first dissimilar conductive part. The first conductive part is in contact with the first layer and the second layer and widens along a second direction crossing the first direction. The second conductive part is provided between a block insulating film of the first memory pillar and the first conductive part, is in contact with the block insulating film and the first conductive part, and is formed from the same material as for the first conductive part. The first dissimilar conductive part is a pair of conductive parts that sandwiches the second conductive part along the first direction between the block insulating film of the first memory pillar and the first conductive part, and is formed from a material different from the material for the first conductive part and the second conductive part. Thereby, the semiconductor memory 1 can reduce a resistance value of the word line WL in the semiconductor memory 1.

Accordingly, in the semiconductor memory according to the embodiment, it is possible to reduce the wiring resistance of the word lines and others.

The memory pillars MP may be structured such that a plurality of pillars is coupled together in the Z direction. For example, the memory pillars MP may be structured such that a pillar penetrating through the conductor 24 (the select gate line SGD) and a pillar penetrating through the plurality of conductors 23 (the word lines WL) are coupled together. The memory pillars MP may be structured such that a plurality of pillars penetrating through the plurality of conductors 23 is coupled together in the Z direction.

In the embodiment, the slits SLT divide the conductors 22 to 24. However, the slits SLT may not divide the conductor 24. In this case, the memory pillars MP are structured such that a plurality of pillars is coupled together in the Z direction, and the pillar provided on the lower side penetrates through the conductors 22 and 23, and the pillar provided on the upper side penetrates through the conductor 24. The conductor 24 is divided by a slit different from the slit SLT, for example, and each of the plurality of divided conductors 24 serves as select gate line SGD.

In the embodiment, the semiconductor memory 1 is structured such that a circuit such as the sense amplifier module 16 is provided under the memory cell array 10 as an example. However, the semiconductor memory 1 is not limited to this. For example, the semiconductor memory 1 may be structured such that the memory cell array 10 and the sense amplifier module 16 are adjacent to each other on the semiconductor substrate 20 in a direction parallel to the surface of the semiconductor substrate 20. In this case, in each of the memory pillars MP, the semiconductor 31 and the source line SL are electrically connected via the bottom surface of the memory pillar MP, for example.

The memory cell array 10 may be structured in other ways. Another structure of the memory cell array 10 is described in the U.S. patent application Ser. No. 12/407,403 titled "THREE-DIMENSIONAL STACKED NONVOLATILE SEMICONDUCTOR MEMORY" and filed on Mar. 19, 2009, for example. Still other structures of the memory cell array 10 are described in the U.S. patent application Ser. No. 12/406,524 titled "THREE-DIMENSIONAL STACKED NONVOLATILE SEMICONDUCTOR MEMORY" and filed on Mar. 18, 2009 and in the U.S. patent application Ser. No. 12/679,991 titled "NONVOLATILE SEMICONDUCTOR MEMORY DEVICE AND MANUFACTURING METHOD THEREOF" and filed on Mar. 25, 2010. Further another structure of the memory cell array 10 is described in the U.S. patent application Ser. No. 12/532,030 titled "SEMICONDUCTOR MEMORY AND METHOD OF MANUFACTURING THE SAME" and filed on Mar. 23, 2009. These patent applications are entirely incorporated herein by reference.

The term "connection" herein refers to electrical connection and does not exclude the intervention of another element between electrically connected components, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a first conductor and a first insulator that are alternately stacked along a first direction; and
   a plurality of memory pillars that penetrates through the stacked first conductor and first insulator, each memory pillar of the plurality of memory pillars including a semiconductor along the first direction, a tunnel insulating film that surrounds a side surface of the semiconductor, a second insulator that surrounds a side surface of the tunnel insulating film, and a block insulating film that surrounds a side surface of the second insulator, wherein
   the plurality of memory pillars include a first memory pillar,
   the first conductor is disposed between adjacent first insulators in the first direction and includes a first conductive part, a second conductive part, and a first dissimilar conductive part, wherein the first conductive part includes a first portion adjacent to the first memory pillar,
   the first conductive part is in contact with adjacent first insulators and widens along a second direction crossing the first direction,
   the second conductive part is disposed between a first block insulating film of the first memory pillar and the first portion of the first conductive part, is in contact with the first block insulating film of the first memory pillar and the first portion of the first conductive part, and is formed from a same material as for the first portion of the first conductive part, and
   the first dissimilar conductive part is a pair of conductive parts that sandwiches the second conductive part along the first direction between the first block insulating film of the first memory pillar and the first portion of the first conductive part, and is formed from a material different from the material for the first portion of the first conductive part and the second conductive part.

2. The semiconductor memory of claim 1, wherein
   the plurality of memory pillars further include a second memory pillar adjacent to the first memory pillar, and
   in a cross section parallel to a surface of a substrate and including the first dissimilar conductive part, a first distance between a center of the first memory pillar and a portion of the first dissimilar conductive part most distant from the first memory pillar is shorter than half a second distance between the center of the first memory pillar and a center of the second memory pillar.

3. The semiconductor memory of claim 1, wherein
   the plurality of memory pillars further include a second memory pillar adjacent to the first memory pillar,
   the first conductor disposed between adjacent first insulators further includes a third conductive part and a second dissimilar conductive part,
   the third conductive part is disposed between a second block insulating film of the second memory pillar and a second portion of the first conductive part, is in contact with the second block insulating film of the second memory pillar and the second portion of the first conductive part, and is formed from the same material as for the second portion of the first conductive part, the second dissimilar conductive part is a pair of conductive parts that sandwiches the third conductive part along the first direction between the second block insulating film of the second memory pillar and the second portion of the first conductive part and is formed from a material different from a material for the first to third conductive parts, and a seam is formed along the first direction in the second portion of the first conductive part between the first memory pillar and the second memory pillar.

4. The semiconductor memory of claim 1, further comprising:

an insulation part that is disposed in a slit extending along a third direction crossing the first direction and dividing the first conductor and first insulator, and is in contact with the first portion of the first conductive part, wherein no memory pillar is included between the first memory pillar and the insulation part, and no seam is included in the first portion of the first conductive part between the first memory pillar and the insulation part.

5. The semiconductor memory of claim 1, wherein a boundary is formed between the first portion of the first conductive part and the second conductive part.

6. The semiconductor memory of claim 1, wherein the first block insulating film of the first memory pillar includes a portion sandwiched between adjacent first insulators.

7. The semiconductor memory of claim 1, wherein the first block insulating film includes a cylinder-shaped first oxide along the first direction and a second oxide different from the first oxide along the first direction, and the second oxide surrounds a side surface of the first oxide.

8. The semiconductor memory of claim 1, wherein each of the pair of conductive parts in the first dissimilar conductive part and the second conductive part is disposed in a single-annular form.

9. The semiconductor memory of claim 1, wherein each of the first conductive part and the second conductive part includes tungsten.

10. The semiconductor memory of claim 1, wherein the first dissimilar conductive part includes titanium nitride.

* * * * *